(12) United States Patent
Ruan

(10) Patent No.: US 11,049,910 B2
(45) Date of Patent: Jun. 29, 2021

(54) PIXEL STRUCTURE AND DISPLAY DEVICE

(71) Applicant: AU Optronics Corporation, Hsin-Chu (TW)

(72) Inventor: Cheng-He Ruan, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 5 days.

(21) Appl. No.: 16/811,132

(22) Filed: Mar. 6, 2020

(65) Prior Publication Data

US 2021/0005679 A1   Jan. 7, 2021

(30) Foreign Application Priority Data

Jul. 5, 2019   (TW) ................................. 108123858

(51) Int. Cl.
  *H01L 27/32*   (2006.01)
  *G09G 3/3208*   (2016.01)

(52) U.S. Cl.
  CPC ....... *H01L 27/3218* (2013.01); *G09G 3/3208* (2013.01); *H01L 27/322* (2013.01); *H01L 27/3246* (2013.01); *H01L 27/3276* (2013.01); *G09G 2300/0456* (2013.01)

(58) Field of Classification Search
  CPC .............. H01L 27/3218; H01L 27/322; H01L 27/3246; H01L 27/3276; H01L 51/5225; H01L 51/5209; H01L 27/3258; H01L 27/3213; H01L 27/326; G09G 3/3208; G09G 2300/0456; G09G 3/2003; G09G 2300/0426; G09G 2300/0452; G09G 2340/0457; G02F 1/134309; G02F 1/133514

See application file for complete search history.

(56) References Cited

U.S. PATENT DOCUMENTS

2003/0231267 A1   12/2003 Murai et al.
2007/0046606 A1*   3/2007 Kim ..................... G09G 3/3648
                                        345/90

(Continued)

FOREIGN PATENT DOCUMENTS

CN   1460878 A   12/2003
CN   107908054 A   4/2018

*Primary Examiner* — Syed I Gheyas
(74) *Attorney, Agent, or Firm* — McClure, Qualey & Rodack, LLP

(57) ABSTRACT

A pixel structure includes a transmissive area and a reflective area. The pixel structure includes a first transparent electrode, a second transparent electrode, a reflective electrode, a first switching element, and a second switching element. The first transparent electrode has a first portion and a second portion connected to each other. The first portion is disposed in the reflective area, and the second portion is disposed in the transmissive area and is narrower than the first portion. The second transparent electrode is disposed in the transmissive area. The reflective electrode is stacked on the first portion of the first transparent electrode and is isolated from the second transparent electrode. The first switching element is disposed in the reflective area and is electrically connected to the first transparent electrode. The second switching element is disposed in the reflective area and is electrically connected to the second transparent electrode.

21 Claims, 17 Drawing Sheets

(56) References Cited

U.S. PATENT DOCUMENTS

| | | | |
|---|---|---|---|
| 2007/0153165 A1* | 7/2007 | Hu | G02F 1/133555 |
| | | | 349/106 |
| 2007/0222925 A1* | 9/2007 | Park | G02F 1/133555 |
| | | | 349/114 |
| 2008/0079876 A1 | 4/2008 | Oka et al. | |
| 2009/0109156 A1* | 4/2009 | Hu | G09G 3/3648 |
| | | | 345/89 |
| 2015/0355492 A1* | 12/2015 | Chu Ke | G02F 1/1368 |
| | | | 257/72 |
| 2019/0189649 A1 | 6/2019 | Ku | |

* cited by examiner

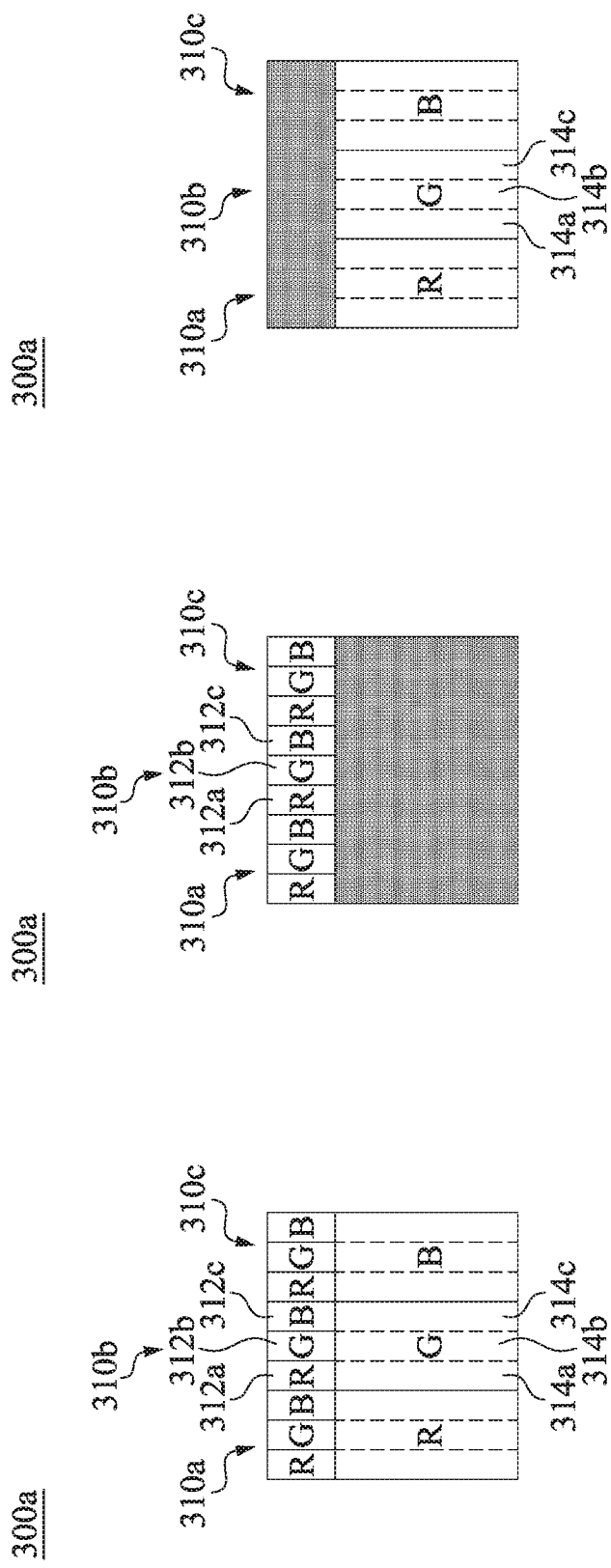

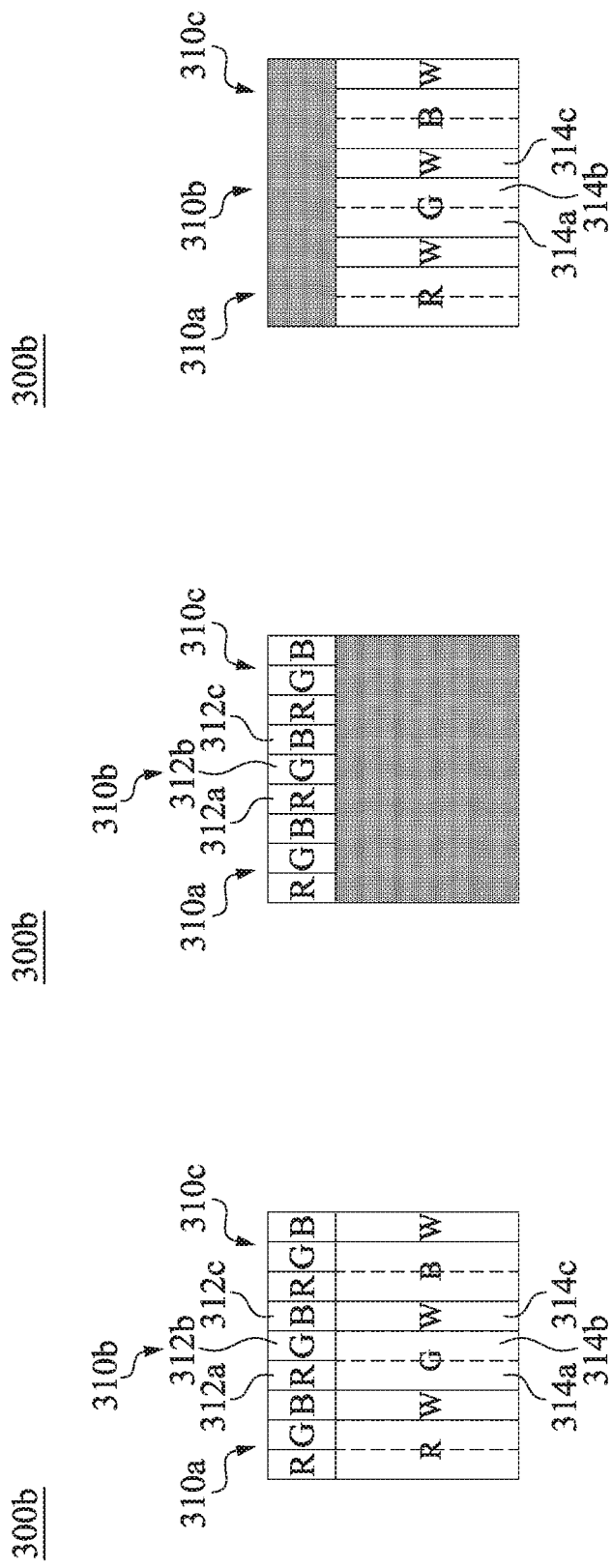

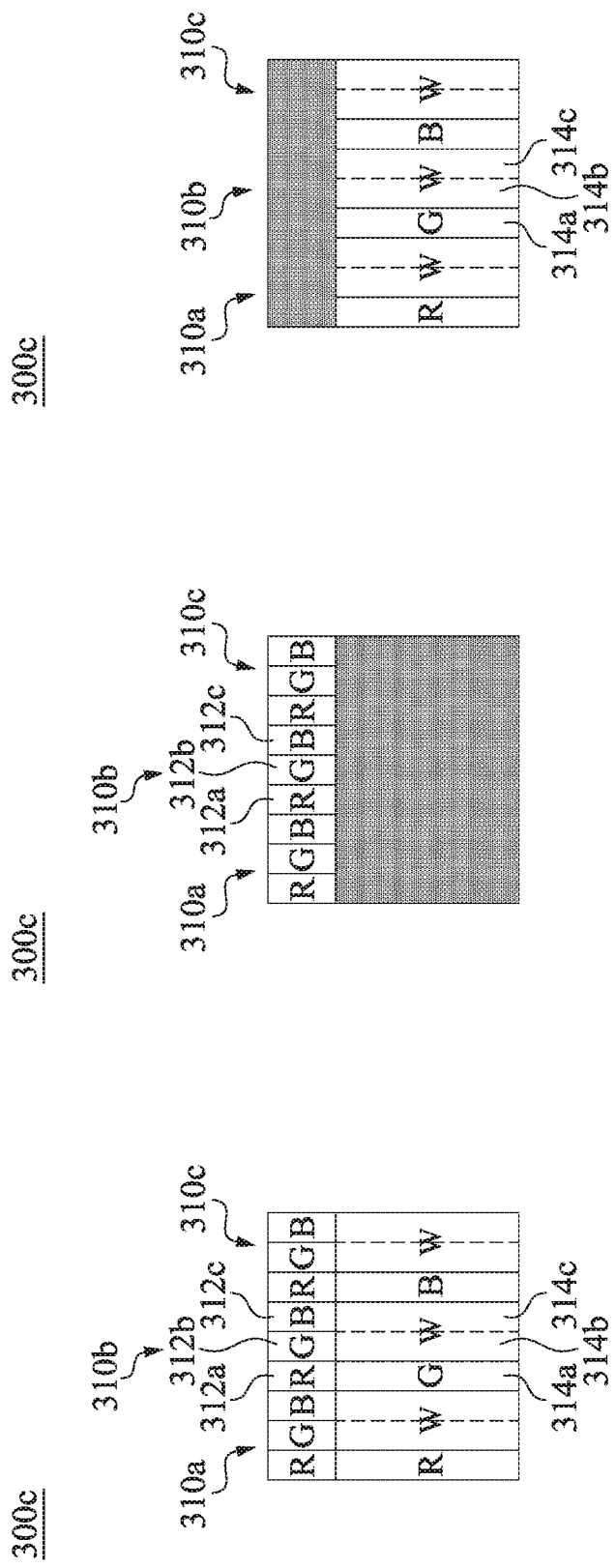

PIXEL STRUCTURE AND DISPLAY DEVICE

CROSS-REFERENCE TO RELATED APPLICATION

This application claims priority to Taiwan Application Serial Number 108123858, filed Jul. 5, 2019, which is herein incorporated by reference in its entirety.

BACKGROUND

Technical Field

The present disclosure relates to a pixel structure and a display device.

Description of Related Art

With advances in technology, displays have been widely used in human life, such as computers, mobile phones, televisions, etc. In addition, since people long for grasping information in time, displays have also been used to display information in many fields, such as refrigerators, navigation, wearable devices, etc, in which watch-type wearable devices have been flourished in recent years, such that various manufacturers provide wearable devices with multiple functions one after another.

However, the continuous power of such wearable devices is to be one key point of the product performance. Users hope it is unnecessary for wearable devices to to be taken off for charging every day. Since the display screen takes most of the power consumption of the whole wearable device, how to provide a more power-saving display device without affecting its display performance has become the development focus of wearable devices.

SUMMARY

According to some embodiments of the present disclosure, a pixel structure includes a transmissive area and a reflective area. The pixel structure includes a first transparent electrode, a second transparent electrode, a first reflective electrode, a first switching element, and a second switching element. The first transparent electrode has a first portion and a second portion connected to each other, the first portion is disposed in the reflective area, and the second portion is disposed in the transmissive area, wherein a width of the first portion is greater than a width of the second portion. The second transparent electrode is disposed in the transmissive area. The first reflective electrode is stacked on the first portion of the first transparent electrode and is electrically isolated from the second transparent electrode. The first switching element is disposed in the reflective area and is electrically connected to the first transparent electrode. The second switching element is disposed in the reflective area and is electrically connected to the second transparent electrode.

According to some other embodiments of the present disclosure, a pixel structure includes a transmissive area and a reflective area. The pixel structure includes a first transparent electrode, a second transparent electrode, a first reflective electrode, a first switching element, and a second switching element. The first transparent electrode has a first portion and a second portion connected to each other, the first portion is disposed in the reflective area, and the second portion is disposed in the transmissive area. The second transparent electrode is disposed in the transmissive area. The first reflective electrode is stacked on the first portion of the first transparent electrode and is electrically isolated from the second transparent electrode, wherein a width of the first reflective electrode is greater than the sum of a width of the second portion of the first transparent electrode and a width of the second transparent electrode. The first switching element is disposed in the reflective area and is electrically connected to the first transparent electrode, and the second switching element is disposed in the reflective area and is electrically connected to the second transparent electrode.

Acoording to yet other embodiments of the present disclosure, a pixel structure includes a first sub-pixel and a second sub-pixel, wherein the first sub-pixel includes a first sub-pixel transmissive area and a first sub-pixel reflective area, and the second sub-pixel includes a second sub-pixel transmissive area and a second sub-pixel reflective area. The pixel structure includes a first transparent electrode, a second transparent electrode, a first reflective electrode, a first switching element, and a second switching element. The first transparent electrode has a first portion and a second portion connected to each other, the first portion is disposed in the first sub-pixel reflective area and the second sub-pixel reflective area, and the second portion is disposed in the first sub-pixel transmissive area. The second transparent electrode is disposed in the second sub-pixel transmissive area. The first reflective electrode is disposed in the first sub-pixel reflective area and the second sub-pixel reflective area. The first switching element is disposed in the first sub-pixel reflective area and is electrically connected to the first transparent electrode. The second switching element is disposed in the second sub-pixel reflective area and is electrically connected to the second transparent electrode.

According to yet other embodiments of the present disclosure, a display device to which the aforementioned pixel structure is applied is provided. The display device includes a first substrate, a plurality of pixel structures disposed on the first substrate, and a second substrate disposed on the first substrate.

The pixel structure provided in the present disclosure includes a first transparent electrode, a second transparent electrode, a first switching element, and a second switching element. The second transparent electrode is disposed in the transmissive area and is electrically connected to the second switching element. The first transparent electrode is disposed in the reflective area and the transmissive area and is electrically connected to the first switching element. The width of the first transparent electrode in the reflective area is greater than the width of the first transparent electrode in the transmissive area, so that the first switching element can control the reflective area and the transmissive area covered by the first transparent electrode at the same time, thereby effectively reducing the number of the switching elements.

BRIEF DESCRIPTION OF THE DRAWINGS

The present disclosure can be more fully understood by reading the following detailed description of the embodiment, with reference made to the accompanying drawings as follows:

FIG. 9A is a schematic view of a color resist distribution of a display device according to one embodiment of the present disclosure.

FIG. 9B is a schematic view of the display device of FIG. 9A in a transmission mode.

FIG. 9C is a schematic view of the display device of FIG. 9A in a reflection mode.

FIG. 10A is a schematic view of a color resist distribution of a display device according to another embodiment of the present disclosure.

FIG. 10B is a schematic view of the display device of FIG. 10A in a transmission mode.

FIG. 10C is a schematic view of the display device of FIG. 10A in a reflection mode.

FIG. 11A is a schematic view of a color resist distribution of a display device according to another embodiment of the present disclosure.

FIG. 11B is a schematic view of the display device of FIG. 11A in a transmission mode.

FIG. 11C is a schematic view of the display device of FIG. 11A in a reflection mode.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other words, in some embodiments of the present invention, these practical details are not necessary. Morevoer, some well-known structures and devices are schematically depicted in order to simplify the drawings.

Figure 1:
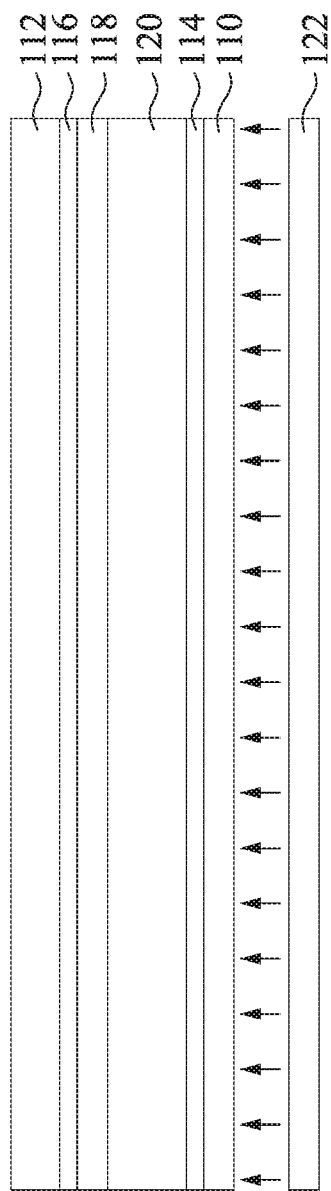
FIG. 1 is a cross-sectional view of a display device according to one embodiment of the present disclosure.
Figure 2:
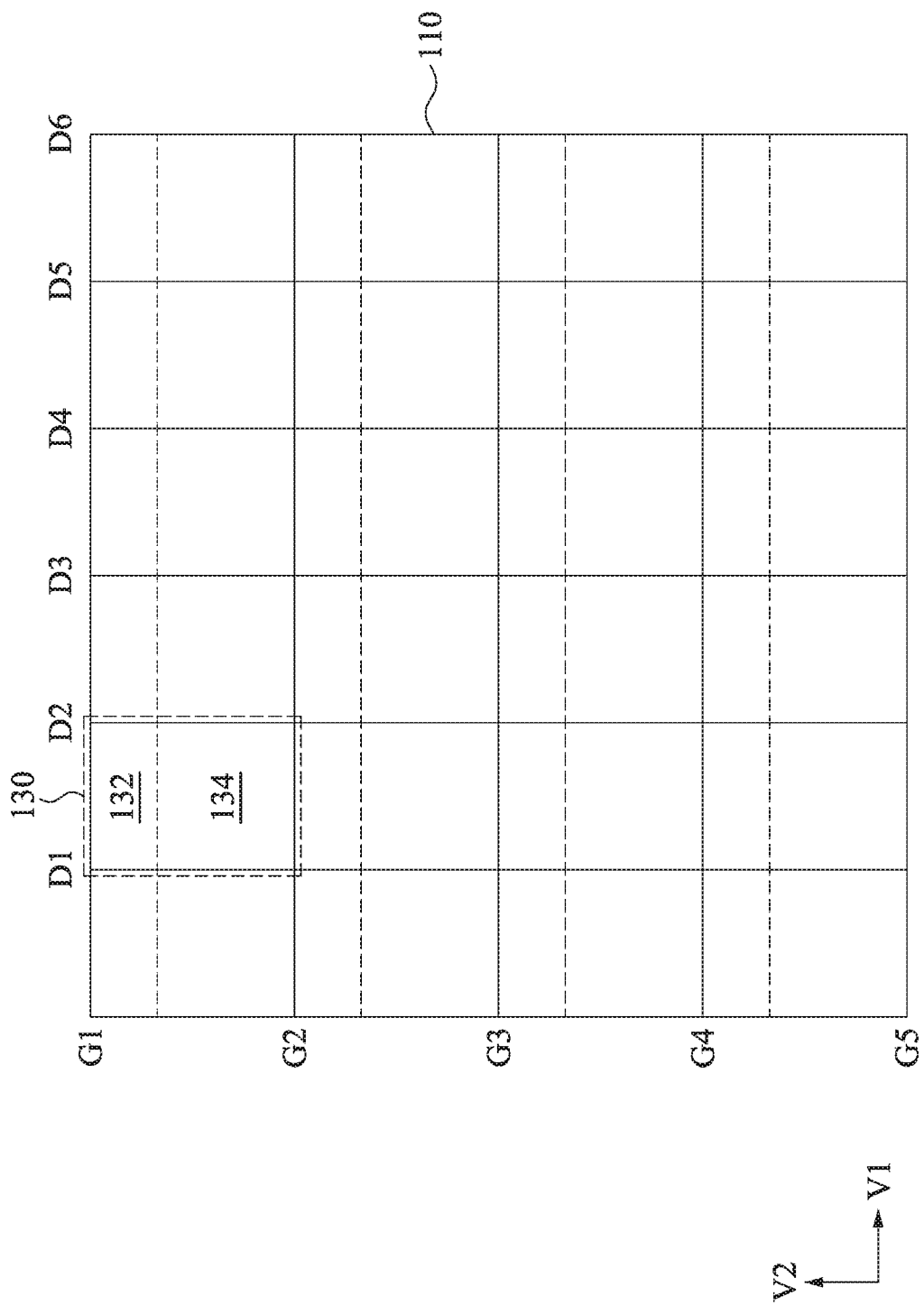
FIG. 2 is a top view of the display device of FIG. 1.

Reference is made to FIG. 1 and FIG. 2, which are a cross-sectional view and a top view of a display device according to one embodiment of the present disclosure, respectively. The display device 10 includes a first substrate 110, a second substrate 112 opposite to the first substrate 110, a pixel arrary 114 disposed on the first substrate 110, a color filter layer 116 and a common electrode layer 118 disposed on the second substrate 112, a display medium layer 120 disposed between the first substrate 110 and second substrate 112, and a backlight module 122.

The first substrate 110 and the second substrate 112 may be glass substrates, plastic substrates, silicon substrates, or other suitable substrates. The pixel array 114 is disposed on the surface of the first substrate 110 facing the second substrate 112, and the pixel array 114 at least includes a plurality of gate lines, a plurality of data lines, a plurality of switching elements, a plurality of pixel electrodes composed of transparent electrodes and reflective electrodes, and so on. It should be noted that, in order to simplify the drawing, FIG. 2 only shows the first substrate 110 and the gate lines and the data lines thereon, such as the gate lines G1-G5 and the data lines D1-D6. The gate lines G1-G5 extend along the first direction V1 and are parallel to each other, and the data lines D1-D6 extend along the second direction V2 and are parallel to each other. In the present embodiment, the first direction V1 may be perpendicular to the second direction V2, so that the gate lines G1-G5 intersect the data lines D1-D6 and a plurality of pixel areas 130 are defined therebetween. The switching elements are electrically connected to the gate lines G1-G5 and the data lines D1-D6. The switching element may be, such as a thin film transistor, and the switching element is further connected to the pixel electrode.

The color filter layer 116 is disposed on the surface of the second substrate 112 facing the first substrate 110. The color filter layer 116 may include a light-shielding pattern and color resists disposed between the light-shielding pattern, wherein the light-shielding pattern covers the gate lines G1-G5 and the data lines D1-D6 to define a plurality of pixel areas 130, and the individual pixel areas 130 are further divided into a transmissive area 132 and a reflective area 134. The common electrode layer 118 is disposed on the color filter layer 116. The material of the common electrode layer 118 may be a transparent conductive material, for example, a metal oxide, such as indium tin oxide, indium zinc oxide, or the like.

The display medium layer 120 is disposed between the first substrate 110 and the second substrate 112. The display medium layer 120 may be, for example, a liquid crystal layer. The backlight module 122 is disposed on one side of the first substrate 110 opposite to the second substrate 112 for providing light. In this way, the display device 10 can use both the light source provided by the backlight module 122 and the external light source for display.

Figure 3:
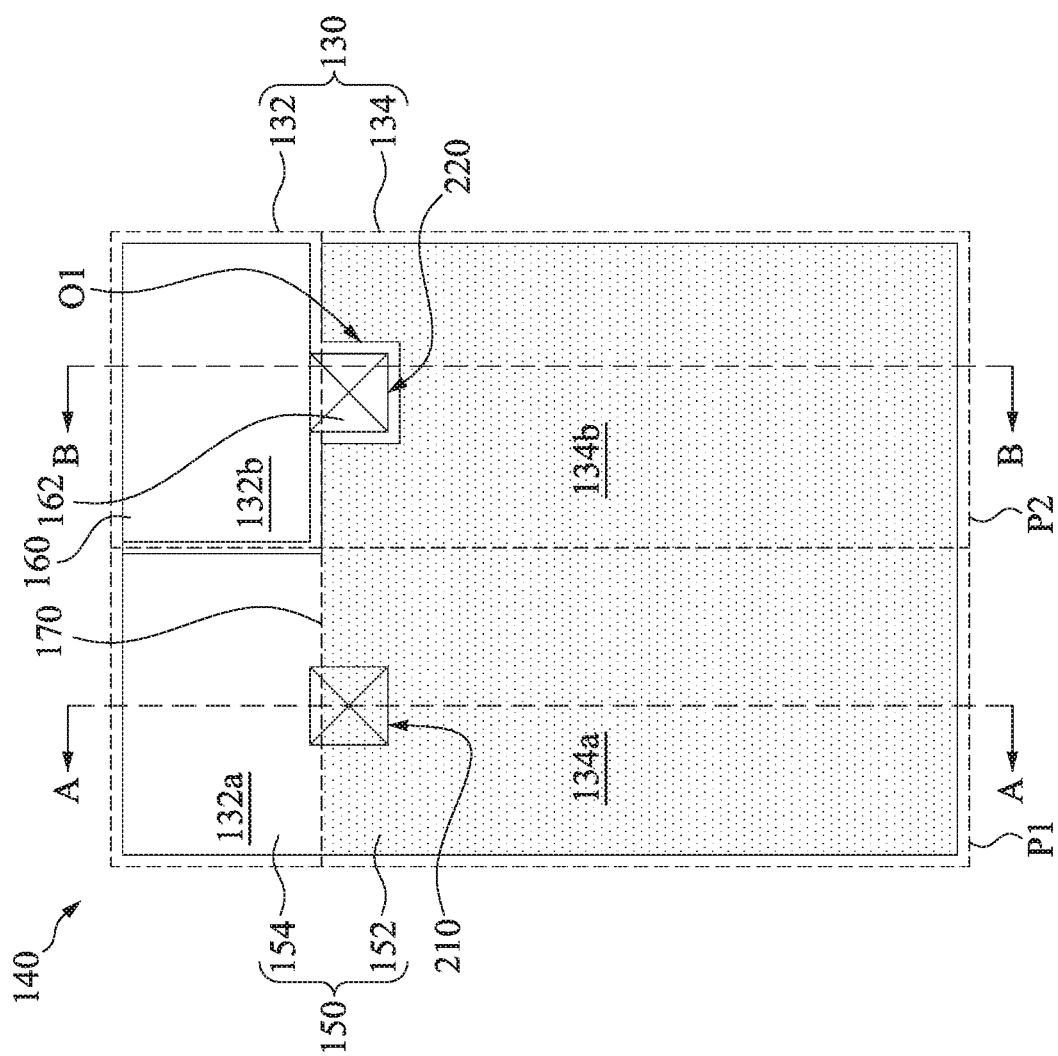
FIG. 3 is a top view of the pixel area of FIG. 2 according to one embodiment.
Figure 4A:
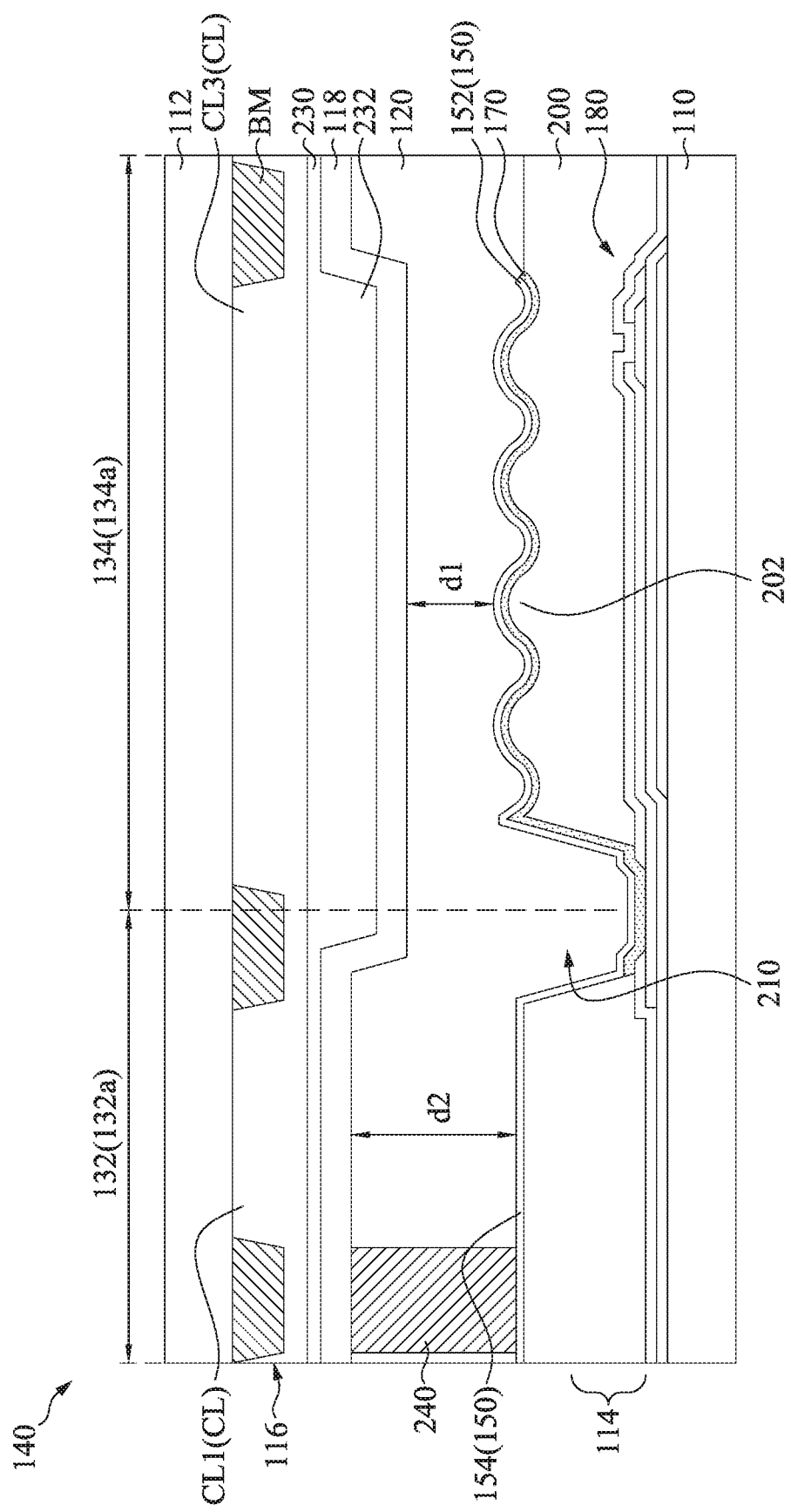
FIG. 4A is a cross-sectional view of FIG. 3 taken along the line A-A.
Figure 4B:
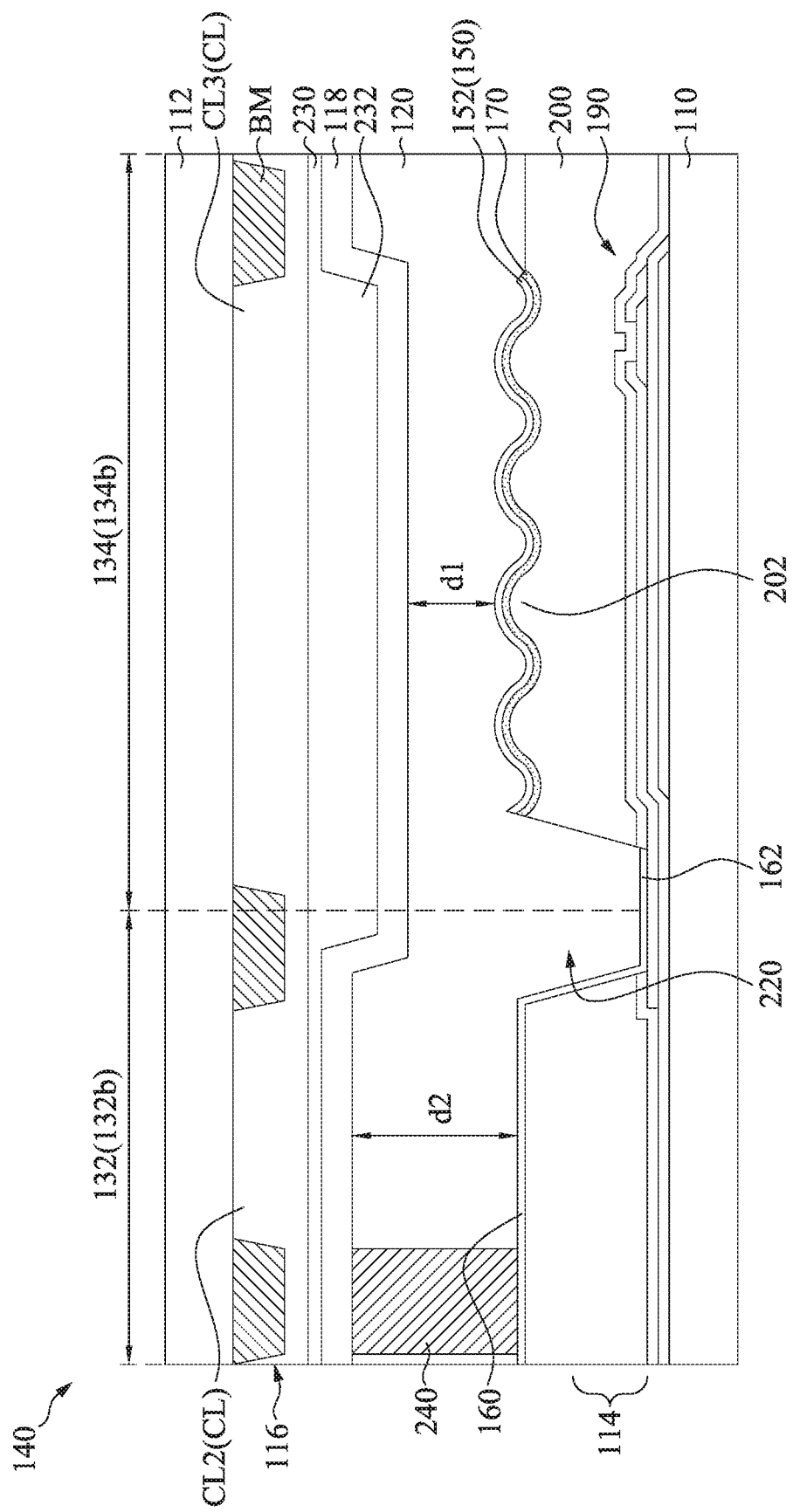
FIG. 4B is a cross-sectional view of FIG. 3 taken along the line B-B.

Reference is made to FIG. 3 in conjunction with FIG. 4A and FIG. 4B, in which FIG. 3 is a top view of the pixel area 130 of FIG. 2 according to one embodiment, FIG. 4A is a cross-sectional view of FIG. 3 taken along the line A-A, and FIG. 4B is a cross-sectional view of FIG. 3 taken along the line B-B. In order to maintain the simplicity of the drawing, it is to be firstly explained that only a first transparent electrode 150, a second transparent electrode 160, a first reflective electrode 170, a first through-hole 210 and a second through-hole 220 are shown in FIG. 3, and the backlight module is not shown in FIG. 4A and FIG. 4B.

Each pixel area 130 is disposed with a pixel structure 140. In the present embodiment, the pixel area 130 includes a transmissive area 132 and a reflective area 134, and the pixel structure 140 disposed in the pixel area 130 is a semi-transmissive and semi-reflective pixel structure, so that the display device, to which this pixel structure 140 is applied, can use the light source provided by the backlight module for display indoors or when the ambient light is insufficient, and can directly use the external light source for display when the ambient light is sufficient.

Adjacent pixel areas 130 can be separated by the light-shielding pattern BM of the color filter layer 116, and the transmissive area 132 and the reflective area 134 in each pixel area 130 can be separated by the light-shielding pattern BM of the color filter layer 116. In some embodiments, in each pixel area 130, the area of the transmissive area 132 may be smaller than that of the reflective area 134, and the transmissive area 132 and the reflective area 134 are aligned vertically. However, the present disclosure is not limited thereto, those skilled in the art can change the configuration of the transmissive area 132 and the reflective area 134 according to different design requirements.

The pixel structure 140 includes a first transparent electrode 150 and a second transparent electrode 160. The first transparent electrode 150 includes a first portion 152 and a second portion 154, wherein the first portion 152 of the first transparent electrode 150 is disposed in the reflective area 134, the second portion 154 of the first transparent electrode 150 is disposed in the transmissive area 132, and the second transparent electrode 160 is also disposed in the transmissive area 132. In some embodiments, the second portion 154 of the first transparent electrode 150 and the second transparent electrode 160 are disposed side by side in the transmissive area 132, and the second portion 154 of the first transparent electrode 150 and the second transparent electrode 160 are electrically isolated. The first portion 152 of the first transparent electrode 150 is electrically connected to the second portion 154 of the first transparent electrode 150, and the first portion 152 of the first transparent electrode 150 is electrically isolated from the second transparent electrode 160.

In some embodiments, the width of the second portion 154 of the first transparent electrode 150 is substantially the same as the width of the second transparent electrode 160, and the second transparent electrode 160 has the area in the tramsmissive area 132 substantially the same as the second transparent electrode 160 has. The width of the first portion 152 of the first transparent electrode 150 is greater than the width of the second portion 154 of the first transparent electrode 150. Furthermore, the width of the first portion 152 of the first transparent electrode 150 is greater than the sum of the width of the second portion 154 of the first transparent electrode 150 and the width of the second transparent electrode 160, such that the second portion 154 of the first transparent electrode 150 and the second transparent electrode 160 are placed side by side on one side of the first portion 152 of the first transparent electrode 150, the second portion 154 of the first transparent electrode 150 is connected to the first portion 152 of the first transparent electrode 150, and the second transparent electrode 160 is separate from the first portion 152 of the first transparent electrode 150.

The pixel structure 140 further includes a first reflective electrode 170, and the first reflective electrode 170 is disposed in the reflective area 134. The first reflective electrode 170 is stacked on the first portion 152 of the first transparent electrode 150 and is electrically connected to the first portion 152 of the first transparent electrode 150. The first reflective electrode 170 is electrically isolated from the second portion 154 of the first transparent electrode 150. In some embodiments, the first reflective electrode 170 completely overlaps the first portion 152 of the first transparent electrode 150, and the shapes and areas of both are the same. The width of the first reflective electrode 170 is also greater than the width of the second portion 154 of the first transparent electrode 150. Furthermore, the width of the first reflective electrode 170 is greater than the sum of the width of the second portion 154 of the first transparent electrode 150 and the width of the second transparent electrode 160. The direction of the width herein is substantially parallel to the extention direction of the gate lines G1-G5 as shown in FIG. 2.

The material of the first transparent electrode 150 and the second transparent electrode 160 may be a conductive material with high light transmittance, for example, a metal oxide, such as indium tin oxide, indium zinc oxide, or other suitable metal oxides. The material of the first reflective electrode 170 has light-shielding and high reflectance properties, for example, a metal.

The pixel structure 140 further includes a first switching element 180 and a second switching element 190. The first switching element 180 and the second switching element 190 are both disposed in the reflective area 134, and are electrically connected to the first transparent electrode 150 and the second transparent electrode 160, respectively. More specifically, the first switching element 180 is electrically connected to the first transparent electrode 150 and the first reflective electrode 170 but is electrically isolated from the second transparent electrode 160; the second switching element 190 is electrically connected to the second transparent electrode 160 but is electrically isolated from the first transparent electrode 150 and the first reflective electrode 170.

In some embodiments, the pixel area 130 can be further divided into a first sub-pixel P1 and a second sub-pixel P2, and the first sub-pixel P1 and the second sub-pixel P2 are arranged side by side. The first sub-pixel P1 includes a first sub-pixel transmissive area 132a and a first sub-pixel reflective area 134a, and the second sub-pixel P2 includes a second sub-pixel transmissive area 132b and a second sub-pixel reflective area 134b. The transmissive area 132 of pixel area 130 is composed of both first sub-pixel transmissive area 132a and second sub-pixel transmissive area 132b, the reflective area 134 of the pixel area 130 is composed of both first sub-pixel reflective area 134a and second sub-pixel reflective area 134b, and the first sub-pixel transmissive area 132a and the second sub-pixel transmissive area 132b can be separated by the light-shielding pattern BM in the color filter layer 116.

In some embodiments, the second portion 154 of the first transparent electrode 150 is disposed in the first sub-pixel transmissive area 132a, the second transparent electrode 160 is disposed in the second sub-pixel transmissive area 132b, the first portion 152 of the first transparent electrode 150 is disposed in the first sub-pixel reflective area 134a and the second sub-pixel reflective area 134b, and the first reflective electrode 170 is also disposed in the first sub-pixel reflective area 134a and the second sub-pixel reflective area 134b. The first switching element 180 is disposed in the first sub-pixel reflective area 134a, and the second switching element 190 is disposed in the second sub-pixel reflective area 134b.

The pixel structure 140 further includes a protective layer 200, and the protective layer 200 covers the first substrate 110 and the first and second switching elements 180 and 190 thereon. The first transparent electrode 150 and the second transparent electrode 160 are disposed on the protective layer 200, and the first reflective electrode 170 is disposed between the first portion 152 of the first transparent electrode 150 and the protective layer 200.

The protective layer 200 has a first through-hole 210 and a second through-hole 220. The first through-hole 210 and the second through-hole 220 are disposed at the interface between the transmissive area 132 and the reflective area 134, so that the first switching element 180 is electrically connected to the first portion 152 of the first transparent electrode 150 and the first reflective electrode 170 through the first through-hole 210, and the second switching element 190 is electrically connected to the second transparent electrode 160 through the second through-hole 220. In other words, the first through-hole 210 and the second through-hole 220 are at least partially disposed in the reflective area 134 and at least partially disposed in the transmissive area 132.

Furthermore, as shown in FIG. 3 and FIG. 4A, in the first sub-pixel P1, a portion of the first switching element 180 is exposed via the first through-hole 210. The first reflective electrode 170 is disposed on the protective layer 200 in the first sub-pixel reflective area 134a, and is extended into the first through-hole 210 and disposed on a side wall and the bottom surface of the first through-hole 210. The first transparent electrode 150 is continuously disposed in the first sub-pixel transmissive area 132a, the first through-hole 210, and the first sub-pixel reflective area 134a. Specifically, the first portion 152 of the first transparent electrode 150 is disposed on the protective layer 200 in the first sub-pixel reflective area 134a, and the second portion 154 of the first transparent electrode 150 is disposed on the protective layer 200 in the first sub-pixel transmissive area 132a. The first transparent electrode 150 further extends into the first through-hole 210 and is disposed on both side walls and the bottom surface of the first through-hole 210, so that the first reflective electrode 170 and the first transparent electrode 150 are electrically connected to the first switching element 180, for example, connected to the drain of the first switching element 180.

In contrast, as shown in FIG. 3 and FIG. 4B, in the second sub-pixel P2, a portion of the second switching element 190 is exposed via the second through-hole 220. The first reflective electrode 170 and the first portion 152 of the first transparent electrode 150 are only disposed on the protective layer 200 in the second sub-pixel reflective area 134b. The first reflective electrode 170 and the first portion 152 of the first transparent electrode 150 are not extended into the second through-hole 220, and are not further electrically connected to the second switching element 190. The second transparent electrode 160 is disposed on the protective layer 200 in the second sub-pixel transmissive area 132b and extends into the second through-hole 220. The second transparent electrode 160 is disposed on a side wall and the bottom surface of the second through-hole 220, so as to be electrically connected to the second switching element 190, for example, connected to the drain of the second switching element 190.

In summary, the first sub-pixel transmissive area 132a and the first sub-pixel reflective area 134a of the first sub-pixel P1 and the second sub-pixel reflective area 134b of the second sub-pixel P2 134b are all controlled by the first switching element 180, and the second sub-pixel transmissive area 132b of the second sub-pixel P2 is controlled by the second switching element 190. Compared with the conventional manner, in which each sub-pixel requires two switching elements to control the sub-pixel transmissive area and the sub-pixel reflective area, respectively, the number of the switching elements can be effectively reduced in the present embodiment.

In some embodiments, in the second sub-pixel P2, the first portion 152 of the first transparent electrode 150 and the first reflective electrode 170 have an opening O1, and the position of the opening O1 is corresponding to the second through-hole 220. The second transparent electrode 160 has an extension pattern 162, and the extension pattern 162 is partially disposed in the opening O1. The extension pattern 162 of the second transparent electrode 160 is a portion where the second transparent electrode 160 extends into the second through-hole 220 to be connected to the second switching element 190.

In some embodiments, the material of the protective layer 200 may be an organic material having a photosensitive property. In addition, the protective layer 200 may have a plurality of protruding structures 202 in the reflective area 134 to increase the reflectivity of the reflective area 134. The protruding structures 202 can be formed on the surface of the protective layer 200 by lithography.

In some embodiments, the color filter layer 116 is disposed on the second substrate 112. The color filter layer 116 includes a light-shielding pattern BM and a color resist layer CL disposed between the light-shielding pattern BM. The light-shielding pattern BM can separate the pixel areas 130 and define the transmissive area 132 and the reflective area 134. The color resist layer CL is arranged to overlap the first transparent electrode 150 and the second transparent electrode 160. The color resist layer CL may include red, green, and blue color resists to provide a light filtering effect. Alternatively, the color resist layer CL may include a white or transparent color resist for the light to pass through.

In some embodiments, the color resist layer CL includes a first color resist CL1 overlapping the second portion 154 of the first transparent electrode 150, a second color resist CL2 overlapping the second transparent electrode 160, and a third color resist CL3 overlapping the first portion 152 of the first transparent electrode 150, wherein the first color resist CL1 is disposed in the first sub-pixel transmissive area 132a, the second color resist CL2 is disposed in the second sub-pixel transmissive area 132b, and the third color resist CL3 is disposed in the first sub-pixel reflective area 134a and the second sub-pixel reflective area 134b. In some embodiments, the color of the first color resist CL1 is different from the color of the second color resist CL2, so that the color of color light emitted from the first sub-pixel transmissive area 132a is different from that emitted from the second sub-pixel transmissive area 132b. The color of the third color resist CL3 is the same as that of the first color resist CL1 or the second color resist CL2.

The pixel structure 140 further includes an over coating layer 230 disposed on the color filter layer 116, and the common electrode layer 118 is disposed on the over coating layer 230. In some embodiments, the over coating layer 230 may have a protruding part 232, which is arranged corresponding to the reflective area 134. The protruding part 232 is protruded toward the first substrate 110, so that the distance d1 between the common electrode layer 118 in the reflective area 134 and the first portion 152 of the first electrode 150 is smaller than the distance d2 between the common electrode layer 118 in the transmissive area 132 and the second portion 154 of the first transparent electrode 150 (or the second transparent electrode 160).

The display medium layer 120 is encapsulated between the first substrate 110 and the second substrate 112. In some embodiments, the pixel structure 140 further includes a spacer 240. The spacer 240 is disposed on the second substrate 112, for example, the spacer 240 is disposed on the common electrode layer 118 and protrudes toward the first substrate 110 to provide sufficient supporting force for packaging the first substrate 110 and the second substrate 112. The spacer 240 can be located under the light-shielding pattern BM, and the spacer 240 may or may not contact the pixel structure 140 on the first substrate 110.

The basic structure of the pixel structure of present disclosure is disclosed in FIG. 3, FIG. 4A and FIG. 4B in detail. By disposing the through-holes of the pixel structure at the interface between the transmissive area and the reflective area, it can use single switching element to simultaneously control the transmissive and reflective areas in the sub-pixel area, thereby reducing the number of switching elements used. The variations of the pixel structure are described in the following embodiments, and the same parts as the basic structure are not be further given.

Figure 5:
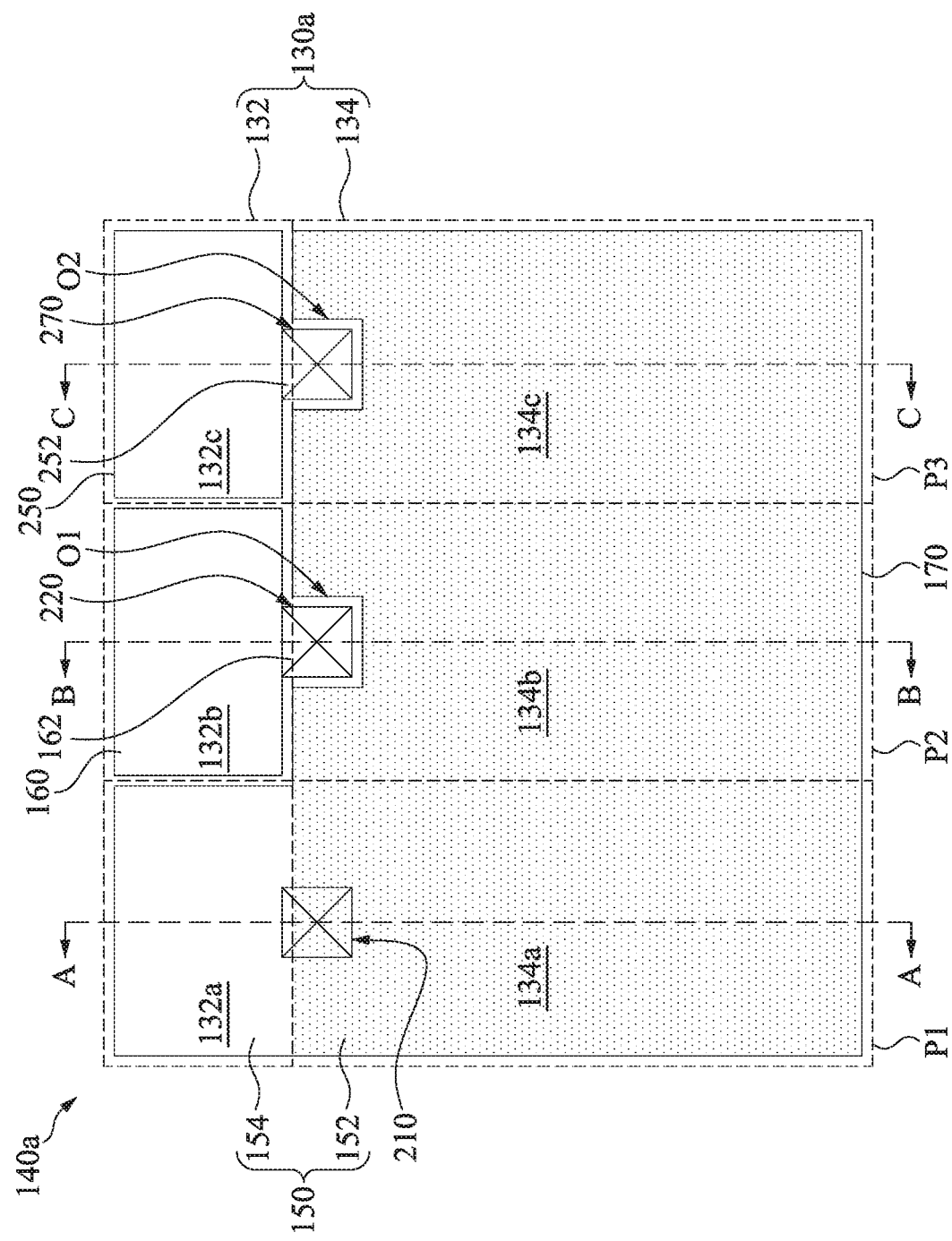
FIG. 5 is a top view of the pixel area of FIG. 2 according to another embodiment.
Figure 6A:
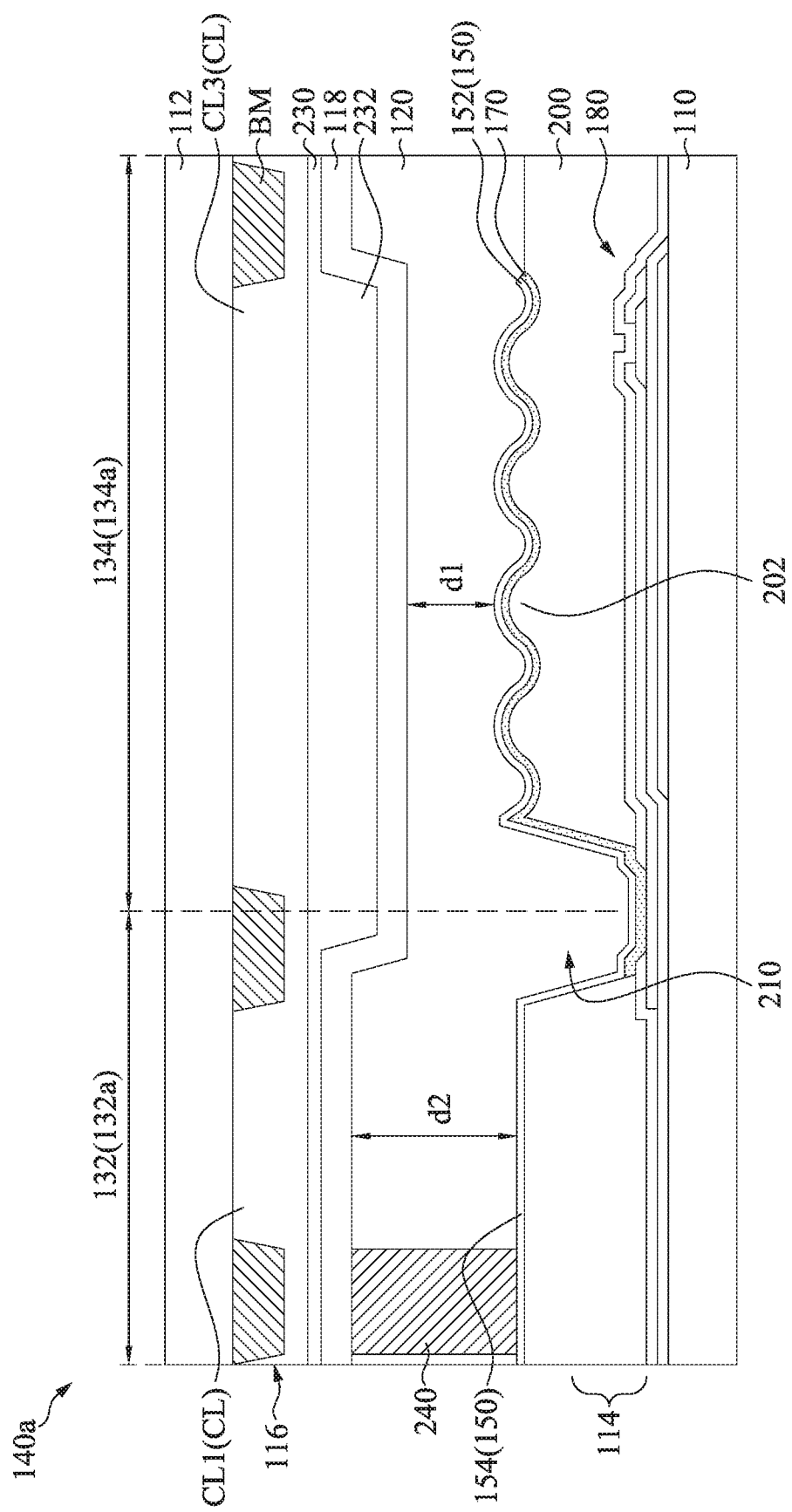
FIG. 6A is a cross-sectional view of FIG. 5 taken along the line A-A.
Figure 6B:
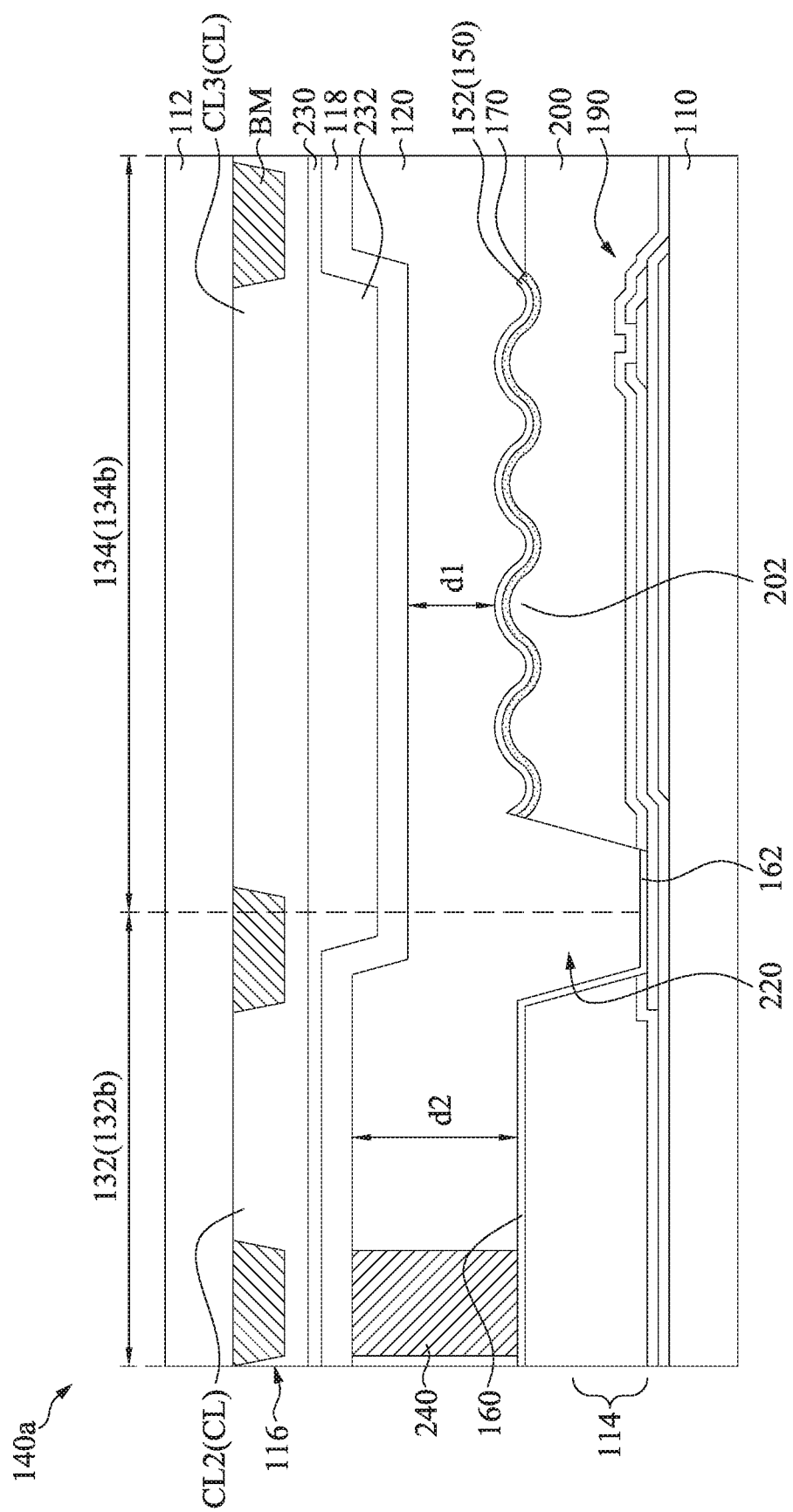
FIG. 6B is a cross-sectional view of FIG. 5 taken along the line B-B.
Figure 6C:
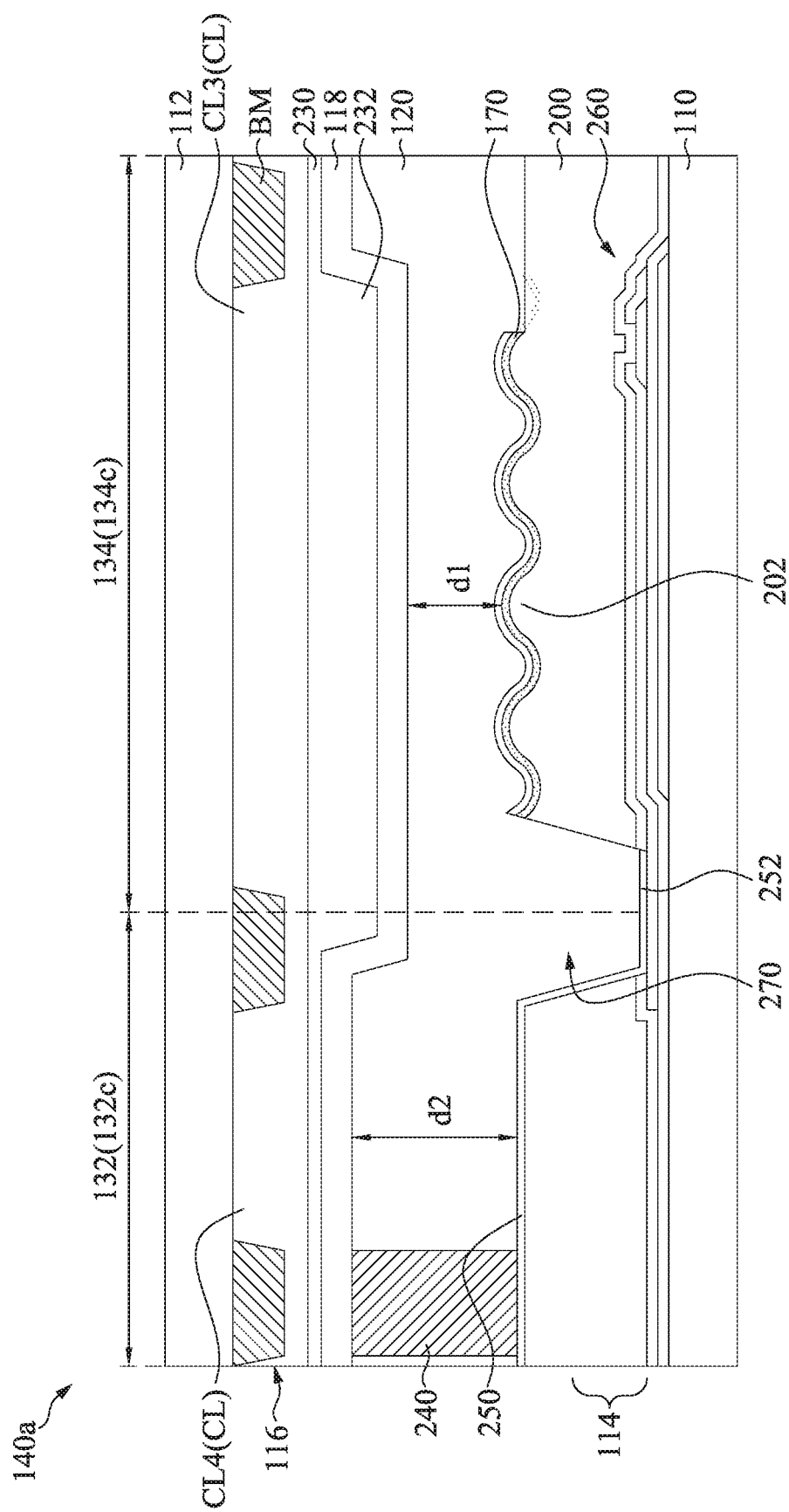
FIG. 6C is a cross-sectional view of FIG. 5 taken along the line C-C.

Next, reference is made to FIG. 5, FIG. 6A, FIG. 6B, and FIG. 6C, wherein FIG. 5 is a top view of the pixel area of FIG. 2 according to another embodiment, FIG. 6A is a cross-sectional view of FIG. 5 taken along the line A-A, FIG. 6B is a cross-sectional view of FIG. 5 taken along the line B-B, and FIG. 6C is a cross-sectional view of FIG. 5 taken along the line C-C. In order to maintain the simplicity of the drawing, it is to be firstly explained that only the first transparent electrode 150, the second transparent electrode 160, the first reflective electrode 170, the third transparent electrode 250, the first through-hole 210, the second through-hole 220, and the third through-hole 230 are shown in FIG. 5, and the backlight module is not shown in FIG. 6A to FIG. 6C.

The difference between the pixel area 130a of the present embodiment and the aforementioned pixel area 130 is that the pixel area 130a further includes a third sub-pixel P3, and the second sub-pixel P2 is disposed between the first sub-pixel P1 and the third sub-pixe P3. The difference between the pixel structure 140a and the aforementioned pixel structure 140 is that the pixel structure 140a further includes a third transparent electrode 250 disposed in the third sub-pixel transmissive area 132c, and the first portion 152 of the first transparent electrode 150 is further disposed on the third sub-pixel reflective area 134c of the third sub-pixel P3.

The cross-sectional views for the first sub-pixel P1 and the second sub-pixel P2 in FIG. 6A and FIG. 6B are substantially the same as those in FIG. 4A and FIG. 4B, and it is not further described herein.

Reference is made to FIG. 5 and FIG. 6C, the width of the third transparent electrode 250 is substantially the same as the width of the second transparent electrode 160, and the third transparent electrode 250 has the area in the transmissive area 132 substantially the same as the second transparent electrode 160 has. The width of the first portion 152 of the first transparent electrode 150 is greater than the sum of the width of the second portion 154 of the first transparent electrode 150 and the width of the third transparent electrode 250, so that the second portion 154 of the first transparent electrode 150, the second transparent electrode 160 and the third transparent electrode 250 are placed side by side on one side of the first portion 152 of the first transparent electrode 150. The third transparent electrode 250 is separated from the second transparent electrode 160, and the third transparent electrode 250 is also separated from the first portion 152 of the first transparent electrode 150.

The first reflective electrode 170 is stacked on the first portion 152 of the first transparent electrode 150. In some embodiments, the first reflective electrode 170 is completely overlapped with the first portion 152 of the first transparent electrode 150, and the shapes and areas of both are the same. The width of the first reflective electrode 170 is greater than the sum of the width of the second portion 154 of the first transparent electrode 150, the width of the second transparent electrode 160, and the width of the third transparent electrode 250.

The pixel structure 140a further includes a third switching element 260, and the third switching element 260 is disposed in the third sub-pixel reflective area 134c. The third switching element 260 is electrically connected to the third transparent electrode 250, and is electrically isolated from the first portion 152 of the first transparent electrode 150 and the first reflective electrode 170.

In the third sub-pixel P3, a portion of the third switching element 260 is exposed via the third through-hole 270. The first reflective electrode 170 and the first portion 152 of the first transparent electrode 150 are only disposed on the protective layer 200 in the third sub-pixel reflective area 134c. The first reflective electrode 170 and the first portion 152 of the first transparent electrode 150 are not extended into the third through-hole 270, and are not further electrically connected to the third switching element 260. The third transparent electrode 250 is disposed on the protective layer 200 in the third sub-pixel transmissive area 132c and is extended into the third through-hole 270, and the third transparent electrode 250 is disposed on a side wall and the bottom surface of the third through-hole 270 to be electrically connected to the third switching element 260, for example, connected to the drain of the third switching element 260.

In the third sub-pixel P3, the first portion 152 of the first transparent electrode 150 and the first reflective electrode 170 further have another opening O2, and the position of the opening O2 is corresponding to the third through-hole 270. The third transparent electrode 250 has an extension pattern 252, and the extension pattern 252 is partially disposed in the opening O2. The extension pattern 252 of the third transparent electrode 250 is a portion where the third transparent electrode 250 extends into the third through-hole 270 to be connected to the third switching element 260.

The color filter layer 116 on the second substrate 112 further includes a fourth color resist CL4, the fourth color resist CL4 overlaps the third transparent electrode 250, and the fourth color resist CL4 is disposed in the third sub-pixel transmissive area 132c. In some embodiments, the fourth color resist CL4 has the color different from the first color resist CL1 (referring to FIG. 6A) and the second color resist CL2 (referring to FIG. 6B), so that the color of color light emitted from the third sub-pixel transmissive area 132a is different from the colors of color lights emitted from the first sub-pixel transmissive area 132a and the second sub-pixel transmissive area 132b. For example, the first color resist CL1, the second color resist CL2, and the fourth color resist CL4 may be a combination of red color resist, blue color resist, and green color resist, so that the first sub-pixel transmissive area 132a, the second sub-pixel transmissive area 132b and the third sub-pixel transmissive area 132c emit red light, blue light, and green light, respectively. The color of the third color resist CL3 may be the same as that of the first color resist CL1, the second color resist CL2, or the fourth color resist CL4.

Figure 7:
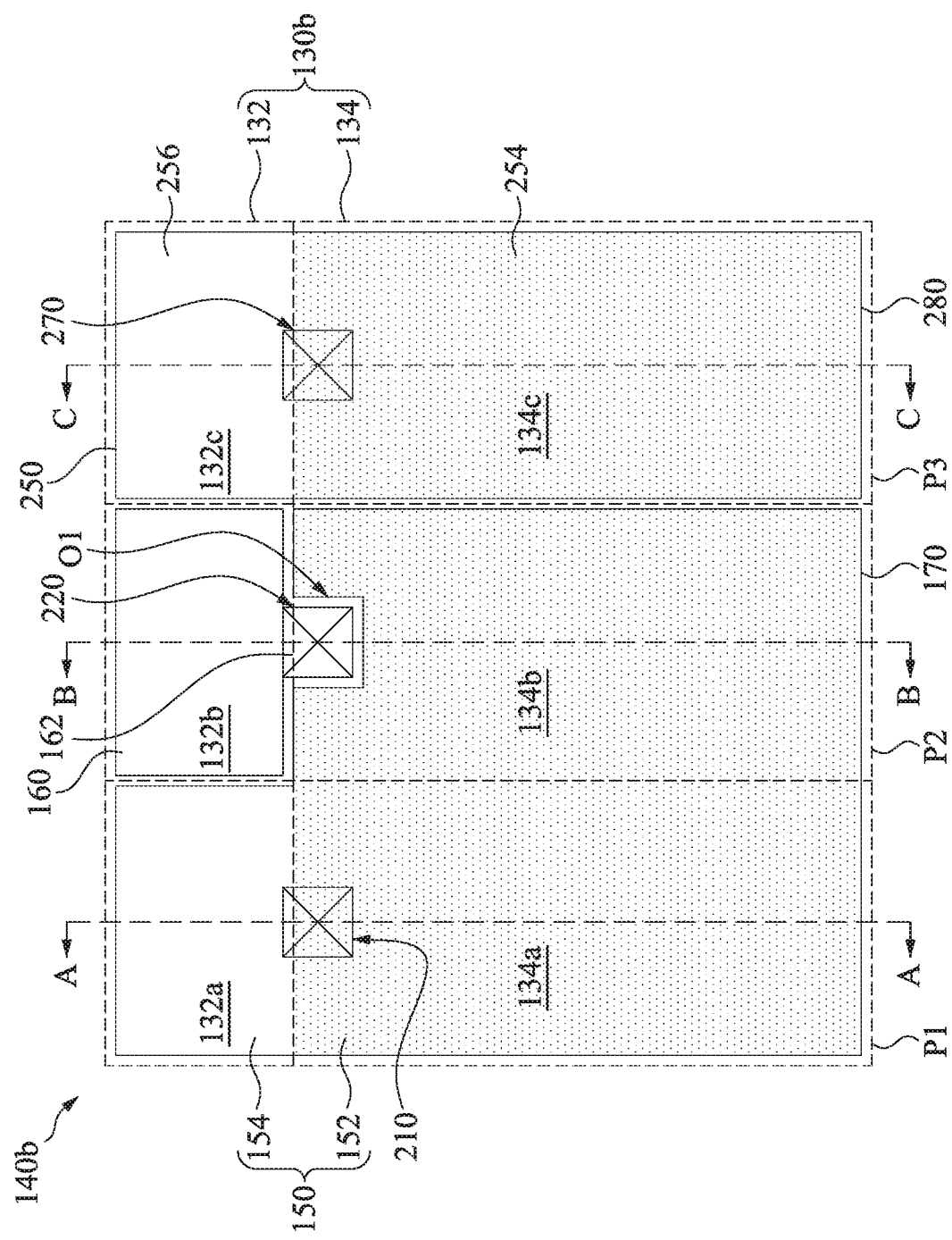
FIG. 7 is a top view of the pixel area of FIG. 2 according to a further embodiment.
Figure 8A:
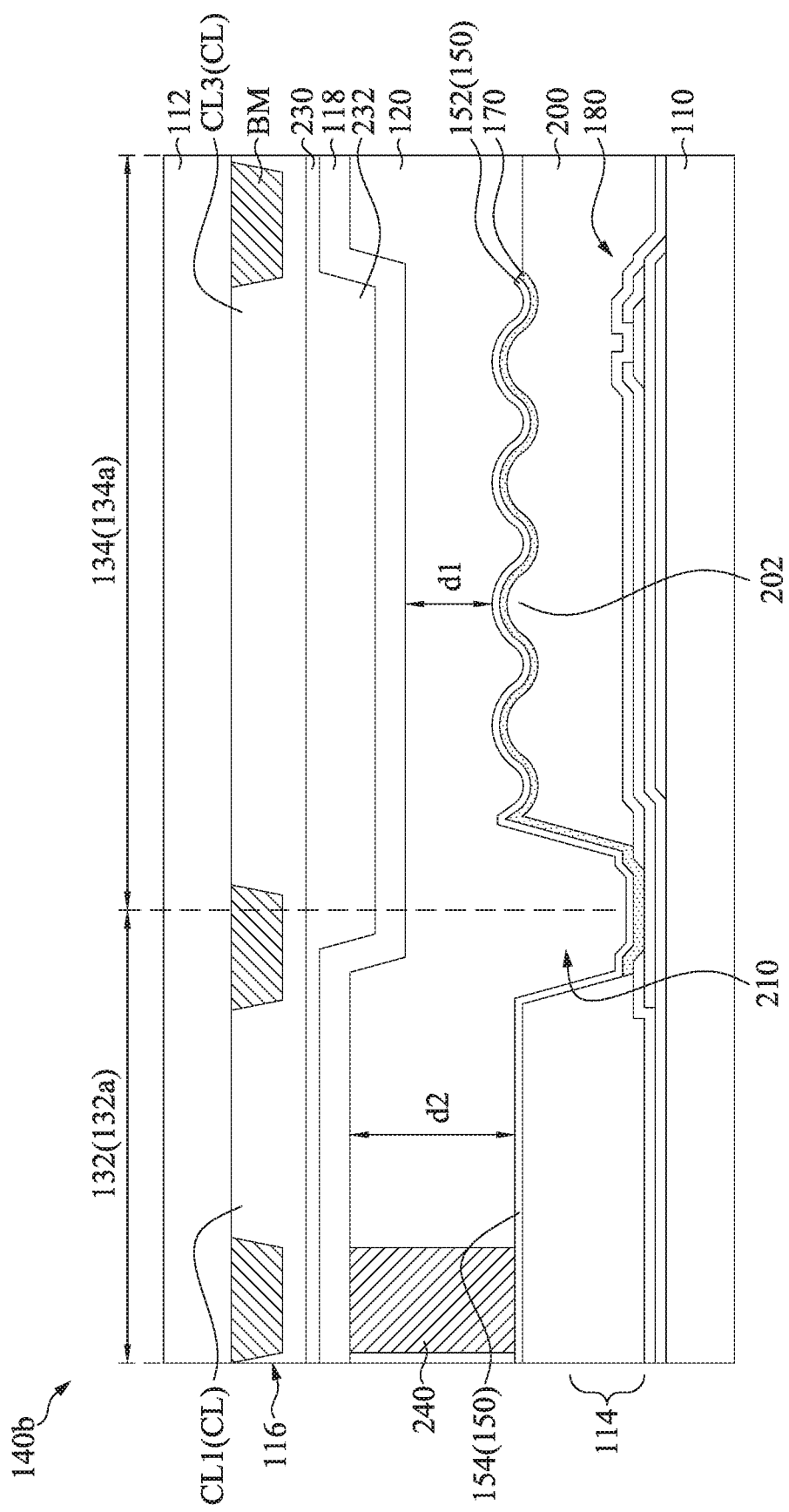
FIG. 8A is a cross-sectional view of FIG. 7 taken along the line A-A.
Figure 8B:
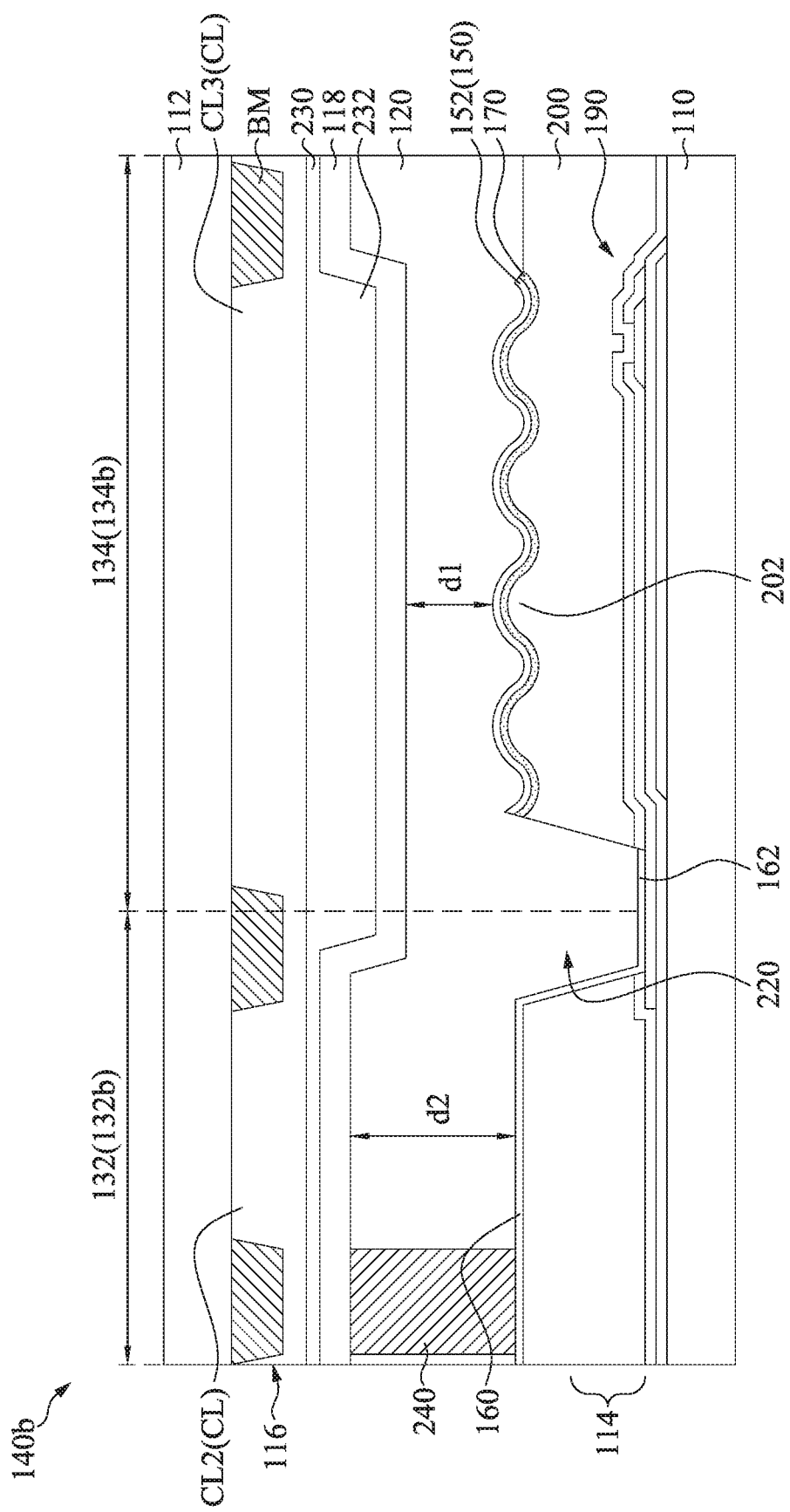
FIG. 8B is a cross-sectional view of FIG. 7 taken along the line B-B.
Figure 8C:
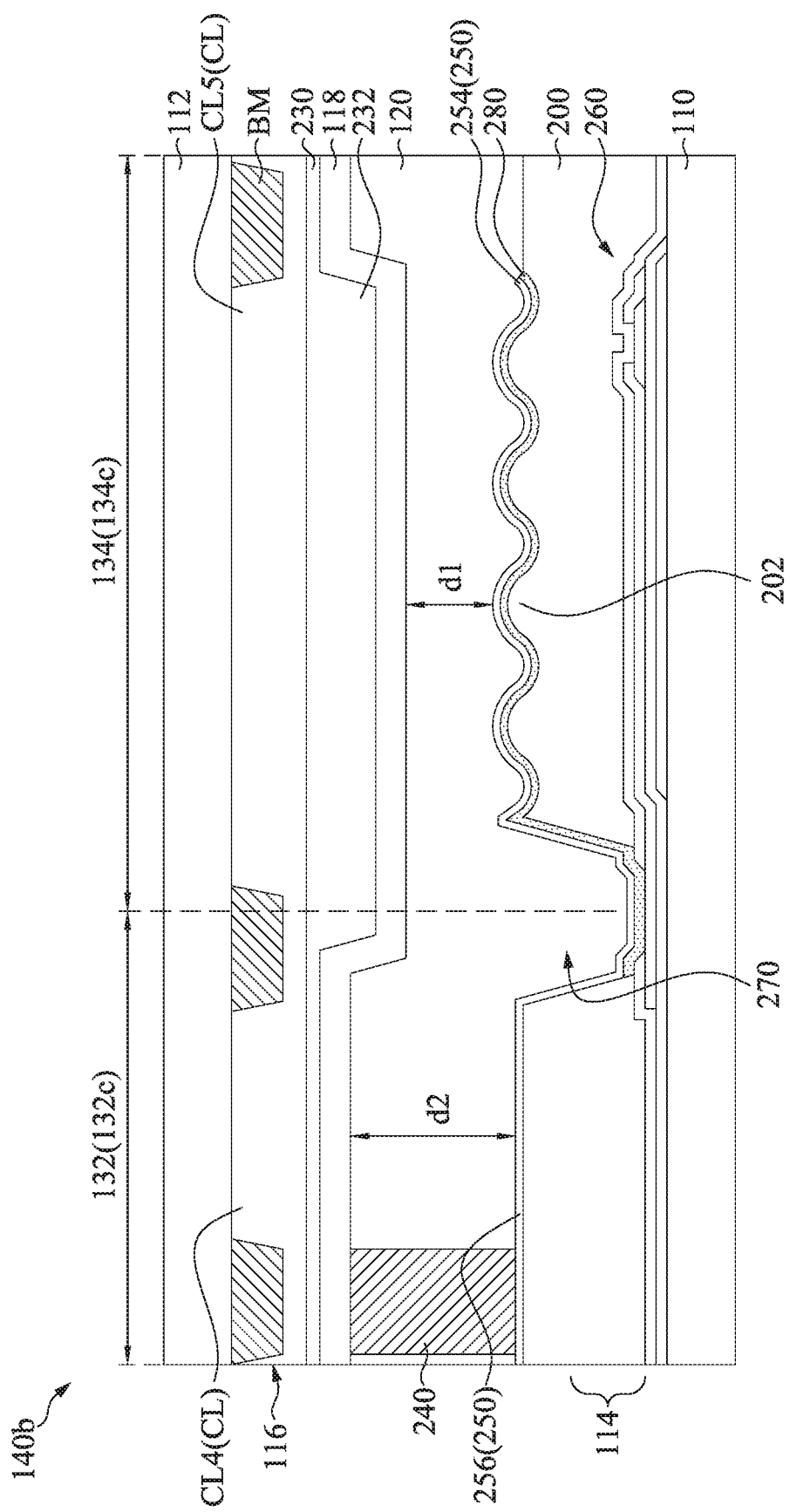
FIG. 8C is a cross-sectional view of FIG. 7 taken along the line C-C.

Next, reference is made to FIG. 7 in conjunction with FIG. 8A, FIG. 8B, and FIG. 8C, wherein FIG. 7 is a top view of the pixel area in FIG. 2 according to a further embodiment, FIG. 8A is a cross-sectional view of FIG. 7 taken along the line A-A, FIG. 8B is a cross-sectional view of FIG. 7 taken along the line B-B, and FIG. 8C is a cross-sectional view of FIG. 7 taken along the line C-C. In order to maintain the simplicity of the drawing, it is to be firstly explained that only the first transparent electrode 150, the second transparent electrode 160, the third transparent electrode 250, the first reflective electrode 170, the second reflective electrode 280, the first through-hole 210, the second through-hole 220 and the third through-hole 270 are shown in FIG. 7, and the backlight module is not shown in FIG. 8A to FIG. 8C.

The difference between the pixel area 130b of the present embodiment and the aforementioned pixel area 130 is that the pixel area 130a further includes a third sub-pixel P3, and the second sub-pixel P2 is disposed between the first sub-pixel P1 and the third sub-pixel P3. The difference between the pixel structure 140b and the aforementioned pixel structure 140 is that the pixel structure 140b further includes a third transparent electrode 250 disposed on the third sub-pixel P3 and a second relective electrode 280 disposed on the third sub-pixel reflective area 134c of the third pixel P3.

The cross-sectional views for the first sub-pixel P1 and the second sub-pixel P2 in FIG. 8A and FIG. 8B are substantially the same as those in FIG. 4A and FIG. 4B, and it is not further described herein.

Reference is made to FIG. 7 and FIG. 8C, the width of the third transparent electrode 250 is substantially the same as the width of the second transparent electrode 160, the third transparent electrode 250 is continuously disposed in the third sub-pixel transmissive area 132c and the third sub-pixel reflective area 134c, and the third transparent electrode 250 is separated from the second transparent electrode 160. Specifically, the third transparent electrode 250 has a first portion 254 and a second portion 256 connected to each other. The first portion 254 of the third transparent electrode 250 is disposed in the third sub-pixel reflective area 134c, and the second portion 256 of the third transparent electrode 250 is disposed in the third sub-pixel transmissive area 132c. The first portion 152 of the first transparent electrode 150 is disposed in the first sub-pixel transmissive area 132a and the second sub-pixel transmissive area 132b, and is separated from the first portion 254 of the third transparent electrode 250 disposed on the third sub-pixel transmissive area 132c.

The first reflective electrode 170 is stacked on the first portion 152 of the first transparent electrode 150. The second reflective electrode 280 is stacked on the first portion 254 of the third transparent electrode 250. The width of the first reflective electrode 170 is greater than the sum of the width of the second portion 154 of the first transparent electrode 150 and the width of the second transparent electrode 160.

The pixel structure 140b further includes a third switching element 260, and the third switching element 260 is disposed in the third sub-pixel reflective area 134c. The third switching element 260 is electrically connected to the third transparent electrode 250 and the second reflective electrode 280, and is electrically isolated from the first portion 152 of the first transparent electrode 150 and the first reflective electrode 170.

In the third sub-pixel P3, a portion of the third switching element 260 is exposed via the third through-hole 270, and the third transparent electrode 250 and the second reflective electrode 280 extend into the third through-hole 270 to be electrically connected with the third switching element 260, for example, connected with the drain of the third switching element 260.

The color filter layer 116 on the second substrate 112 further includes a fourth color resist CL4 and a fifth color resist CL5. The fourth color resist CL4 overlaps the second portion 256 of the third transparent electrode 250 and is disposed in the third sub-pixel transmissive area 132c, and the fifth color resist CL5 overlaps the first portion 254 of the third transparent electrode 250 and is disposed in the third sub-pixel reflective area 134c. In some embodiments, the color of the fourth color resist CL4 is different from that of the first color resist CL1 (referring to FIG. 8A) and the second color resist CL2 (referring to FIG. 8B), so that the color of the color light emitted from the third sub-pixel transmissive area 132c is different from that emitted from the first sub-pixel transmissive area 132a and the second sub-pixel transmissive area 132b. For example, the first color resist CL1, the second color resist CL2, and the fourth color resist CL4 may be a combination of red color resist, blue color resist, and green color resist, so that the first sub-pixel transmissive area 132a, the second sub-pixel transmissive area 132b and the third sub-pixel transmissive area 132c emit red light, blue light, and green light, respectively. The color of the third color resist CL3 (referring to FIG. 8A) may be the same as the first color resist CL1, the second color resist CL2, or the fourth color resist CL4, and the color of the fifth color resist CL5 may be the same as or different from the color of the third color resist CL3.

Next, reference is made to FIG. 9A to FIG. 9C, wherein FIG. 9A is a schematic view of a color resist distribution of a display device according to one embodiment of the present disclosure, FIG. 9B is a schematic view of the display device of FIG. 9A in a transmission mode, and FIG. 9C is a schematic view of the display device of FIG. 9A in a reflection mode.

Reference is made to FIG. 9A first. The display device 300a has a plurality of pixel areas. For facilitating the explaination, only three pixel areas 310a, 310b, and 310c are shown in the drawing, each pixel area further includes a first sub-pixel transmissive area 312a, a second sub-pixel transmissive area 312b and a third sub-pixel transmissive area 312c side by side, and a first sub-pixel reflective area 314a, a second sub-pixel reflective area 314b, and a third sub-pixel reflective area 314c side by side, from which the lights are emitted can be determined by the distribution of the color resist layer of the aforementioned color filter layer.

In the present embodiment, the first sub-pixel transmissive area 312a, the second sub-pixel transmissive area 312b, and the third sub-pixel transmissive area 312c are respectively corresponding to red (R), green (G), and blue (B) of three primary colors. The first sub-pixel reflective area 314a, the second sub-pixel reflective area 314b, and the third sub-pixel reflective area 314c of the pixel area 310a are all the same color, such as red. The first sub-pixel reflective area 314a, the second sub-pixel reflective area 314b, and the third sub-pixel reflective area 314c of the pixel area 310b are all the same color, such as green. The first sub-pixel reflective area 314a, the second sub-pixel reflective area 314b, and the third sub-pixel reflective area 314c of the pixel area 310c are all the same color, such as blue.

Next, reference is made to FIG. 9B. In the transmission mode, for example, indoors or where the ambient light intensity is insufficient, the light source of the display device 300a comes from the backlight module, and the light emitted from the backlight module passes through the first sub-pixel transmissive area 312a of the pixel area 310a, the second sub-pixel transmissive area 312b of the pixel area 310b, and the third sub-pixel transmissive area 312c of the pixel area 310c, and is blocked by the reflective electrodes in the aforementioned reflective area instead of passing through the first sub-pixel reflective area 314a of the pixel area 310a, the second sub-pixel reflective area 314b of the pixel area 310b, and the third sub-pixel reflective area 314c of the pixel area 310c (referring to FIG. 9A).

In contrast, as shown in FIG. 9C, in the reflection mode, for example, outdoors or where the ambient light intensity is strong, the light source of the display device 300a comes from the external ambient light, and the backlight module is turned off at this time. The ambient light is reflected by the reflective electrodes in the aforementioned reflective area and passes through the first sub-pixel reflective area 314a of the pixel area 310a, the second sub-pixel reflective area 314b of the pixel area 310b, and the third sub-pixel reflective area 314c of the pixel area 310c to emit color light. The first sub-pixel transmissive area 312a of the pixel area 310a, the second sub-pixel transmissive area 312b of the pixel area 310b, and the third sub-pixel transmissive area 312c of the pixel area 310c (referring to FIG. 9A) fail to emit light due to no light provided from the backlight module.

Next, reference is made to FIG. 10A to FIG. 10C, wherein FIG. 10A is a schematic view of a color resist distribution of a display devicea according to another embodiment of the present disclosure, FIG. 10B is a schematic view of the display device of FIG. 10A in the transmission mode, and FIG. 10C is a schematic view of the display device of FIG. 10A in the reflection mode. The difference between the present embodiment and the previous embodiment is that the display device 300b further includes a white color resist to enhance the contrast of the display device 300b.

Reference is made to FIG. 10A first. In the present embodiment, the first sub-pixel transmissive area 312a, the second sub-pixel transmissive area 312b, and the third sub-pixel transmissive area 312c are respectively corresponding to red (R), green (G), blue (B) of three primary colors. The first sub-pixel reflective area 314a and the second sub-pixel reflective area 314b of the pixel area 310a are both the same color, such as red, and the third sub-pixel reflective area 314c is white. The first sub-pixel reflective area 314a and the second sub-pixel reflective area 314b of the pixel area 310b are all the same color, such as green, and the third sub-pixel reflective area 314c is white. The first sub-pixel reflective area 314a and the second sub-pixel reflective area 314b of the pixel area 310c are both the same color, such as blue, and the third sub-pixel reflective area 314c is white.

Next, reference is made to FIG. 10B. In the transmission mode, for example, indoors or where the ambient light intensity is insufficient, the light source of the display device 300b comes from the backlight module, and the light emitted from the backlight module passes through the first sub-pixel transmissive area 312a of the pixel area 310a, the second sub-pixel transmissive area 312b of the pixel area 310b, and the third sub-pixel transmissive area 312c of the pixel area 310c, and is blocked by the reflective electrodes in the aforementioned reflective area instead of passing through the first sub-pixel reflective area 314a of the pixel area 310a, the second sub-pixel reflective area 314b of the pixel area 310b, and the third sub-pixel reflective area 314c of the pixel area 310c (referring to FIG. 10A).

In contrast, as shown in FIG. 10C, in the reflection mode, for example, outdoors or where the ambient light intensity is strong, the light source of the display device 300b comes from the external ambient light, and the backlight module is turned off at this time. The ambient light is reflected by the reflective electrodes in the aforementioned reflective area and passes through the first sub-pixel reflective area 314a of the pixel area 310a, the second sub-pixel reflective area 314b of the pixel area 310b, and the third sub-pixel reflective area 314c of the pixel area 310c to emit color light. The first sub-pixel transmissive area 312a of the pixel area 310a, the second sub-pixel transmissive area 312b of the pixel area 310b, and the third sub-pixel transmissive area 312c of the pixel area 310c (referring to FIG. 10A) fail to emit light due to no light provided from the backlight module.

Alternatively, as shown in FIG. 11A to FIG. 11C, wherein FIG. 11A is a schematic view of a color resist distribution of a display device according to a further embodiment of the present disclosure, FIG. 11B is a schematic view of the display device of FIG. 11A in the transmission mode, and FIG. 11C is a schematic view of the display device of FIG. 11A in the reflection mode. The difference between the present embodiment and the previous embodiment is that the proportion of white color resist in the display device 300c is increased to further enhance the contrast of the display device 300c, particularly in the reflection mode.

Reference is made to FIG. 11A first. In the present embodiment, the first sub-pixel transmissive area 312a, the second sub-pixel transmissive area 312b, and the third sub-pixel transmissive area 312c are respectively corresponding to red (R), green (G), blue (B) of three primary colors. In the pixel area 310a, first sub-pixel reflective area 314a is red, and the second sub-pixel reflective area 314b and the third sub-pixel reflective area 314c are both white. In the pixel area 310b, the first sub-pixel reflective area 314a is green, and the second sub-pixel reflective area 314b and the third sub-pixel reflective area 314c are both white. In the pixel area 310c, the first sub-pixel reflective area 314a is blue, and the second sub-pixel reflective area 314b and the third sub-pixel reflective area 314c are both white.

Next, reference is made to FIG. 11B. In the transmission mode, for example, indoors or where the ambient light intensity is insufficient, the light source of the display device 300c comes from the backlight module, and the light emitted from the backlight module passess through the first sub-pixel transmissive area 312a of the pixel area 310a, the second sub-pixel transmissive area 312b of the pixel area 310b, and the third sub-pixel transmissive area 312c of the pixel area 310c, and is blocked by the reflective electrodes in the aforementioned reflective area instead of passing through the first sub-pixel reflective area 314a of the pixel area 310a, the second sub-pixel reflective area 314b of the pixel area 310b, and the third sub-pixel reflective area 314c of the pixel area 310c (referring to FIG. 11A).

In contrast, as shown in FIG. 11C, in the reflection mode, for example, outdoors or where the ambient light intensity is strong, the light source of the display device 300c comes from the ambient light, and the backlight module is turned off at this time. The ambient light is reflected by the reflective electrodes in the aforementioned reflective area and passes through the first sub-pixel reflective area 314a of the pixel area 310a, the second sub-pixel reflective area 314b of the pixel area 310b, and the third sub-pixel reflective area 314c of the pixel area 310c to emit color light. The first sub-pixel transmissive area 312a of the pixel area 310a, the second sub-pixel transmissive area 312b of the pixel area 310b, and the third sub-pixel transmissive area 312c of the pixel area 310c (referring to FIG. 11A) fail to emit light due to no light provided from the backlight module.

The pixel arrangement and color resist distribution disclosed in the aforementioned embodiments are merely examples, and are not intended to limit the scope of the present disclosure. Those skilled in the art can make changes according to actual needs.

The aforementioned pixel structure is not only applicable to liquid crystal displays, but also not limited to the semi-transmissive and semi-reflective display manner. For example, the aforementioned pixel structure can also be applied to an organic light-emitting diode display device, and the brightness of the organic light-emitting diode display device can be enhanced by reflecting part of the light back to the display surface.

Figure 12:
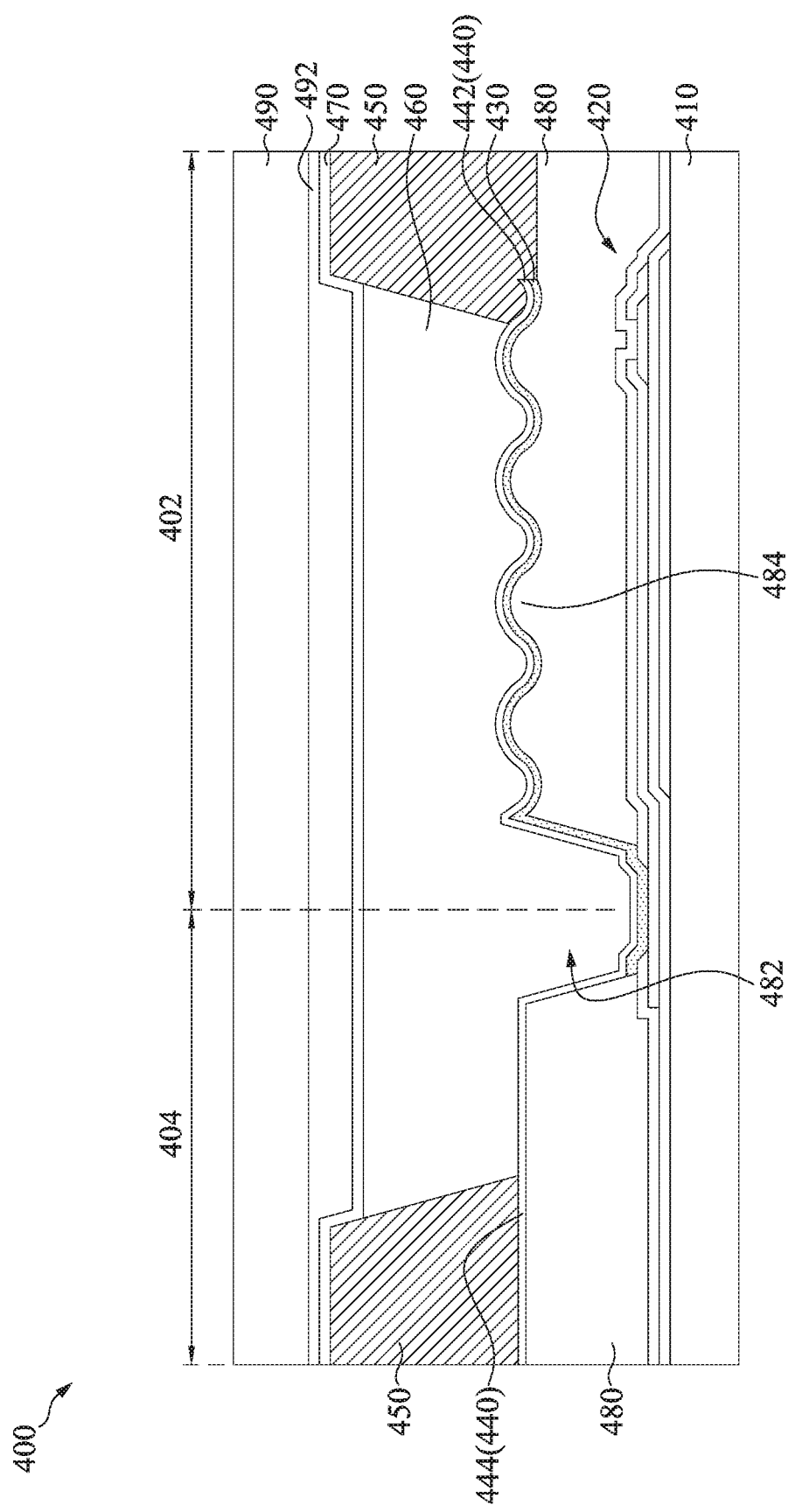
FIG. 12 is a cross-sectional view of a pixel structure iaccording to a further embodiment of the present discloure.

Reference is made to FIG. 12, which is a cross-sectional view of a pixel structure according to a further embodiment of the present disclosure. The pixel structure 400 is applied to the organic light-emitting diode display device, and includes a switching element 420, a reflective electrode 430, a first transparent electrode 440, a pixel definition layer 450, and an organic light-emitting layer 460, a second transparent electrode 470, and a protective layer 480 disposed on a first substrate 410.

The switching element 420 is disposed in the reflective area 402, and the switching element 420 may be, for example, a thin film transistor. The protective layer 480 is disposed on the first substrate 410 and the switching element 420. The protective layer 480 has a through-hole 482 so that a portion of the switching element 420 is exposed via the through-hole 482. The position of the through-hole 482 is located at the interface between the reflective area 402 and the transmissive area 404, a portion of the through-hole 482 is located in the reflective area 402, and a portion of the through-hole 482 is located in the transmissive area 404.

The pixel definition layer 450 is disposed on the protective layer 480, and is configured to define a plurality of sub-pixel areas, each of which includes a reflective area 402 and a transmissive area 404. The reflective electrode 430 is disposed in the reflective area 402 and is disposed on the upper surface of the protective layer 480. The protective layer 480 may have a plurality of protruding structures 484 for increasing the reflectivity of the reflective electrode 430. The reflective electrode 430 is connected to the switching element 420 through the through-hole 482, for example, connected to the drain of the switching element 420.

The first transparent electrode 440 is disposed on the protective layer 480 and is continuously disposed in the reflective area 402 and the transmissive area 404. In the reflective area 402, the reflective electrode 430 is disposed between the first transparent electrode 440 and the protective layer 480. The first transparent electrode 440 is connected to the switching element 420 through the through-hole 482. In other words, the switching element 420 is electrically connected to the first transparent electrode 440 and the reflective electrode 430.

The organic light-emitting layer 460 is disposed in the sub-pixel areas defined by the pixel definition layer 450, and is in contact with the first transparent electrode 440. In the present embodiment, a partial organic light-emitting layer 460 fills the through-hole 482. The organic light-emitting layer 460 may include a stack of organic materials, and the color emitted by the organic light-emitting layer 460 may be red light, blue light, green light, or white light. The second transparent electrode 470 is disposed on the organic light-emitting layer 460 and pixel defining layer 450. The second substrate 490 is disposed opposite to the first substrate 410, and a over coating layer 492 is provided between the second substrate 490 and the second transparent electrode 470.

The light emitted by the organic light-emitting layer 460 can be concentrated to the display surface by adding the reflective electrode 430 in the pixel structure 400, thereby enhancing the light utilization efficiency of the organic light-emitting diode display panel. The color distribution of the organic light-emitting layer 460 can be referring to FIG. 9A, FIG. 10A, and FIG. 11A. Other variations of the pixel structure 400 applied to the organic light-emitting diode display device can be referred to the aforementioned pixel structures 140, 140a, and 140b, and the detailed description is not further given herein.

In summary, the pixel structure provided in the present disclosure includes a first transparent electrode, a second transparent electrode, a first switching element, and a second switching element. The second transparent electrode is disposed in the transmissive area and is electrically connected to the second switching element. The first transparent electrode is disposed in the reflective area and the transmissive area and is electrically connected to the first switching element. The width of the first transparent electrode in the reflective area is greater than the width of the first transparent electrode in the transmissive area, so that the first switching element can control the reflective area and the transmissive area covered by the first transparent electrode at the same time, thereby effectively reducing the number of the switching elements. While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A pixel structure comprising a transmissive area and a reflective area, the pixel structure comprising:
a first transparent electrode having a first portion and a second portion connected to each other, the first portion being disposed in the reflective area, and the second portion being disposed in the transmissive area, wherein a width of the first portion is greater than a width of the second portion;
a second transparent electrode disposed in the transmissive area;
a first reflective electrode stacked on the first portion of the first transparent electrode and electrically isolated from the second transparent electrode;
a first switching element disposed in the reflective area and electrically connected to the first transparent electrode; and
a second switching element disposed in the reflective area and electrically connected to the second transparent electrode.

2. The pixel structure of claim 1, wherein the first portion of the first transparent electrode and the first reflective electrode have an opening, the second transparent electrode has an extension pattern, and the extension pattern is partially disposed in the opening.

3. The pixel structure of claim 1, further comprising:
a protective layer disposed on the first switching element and the second switching element, the first reflective electrode being disposed between the protective layer and the first portion of the first transparent electrode, and the protective layer having a first through-hole and a second through-hole at least partially disposed in the reflective area, wherein the first switching element is connected to the first transparent electrode through the first through-hole, and the second switching element is connected to the second transparent electrode through the second through-hole.

4. The pixel structure of claim 1, further comprising:
a third transparent electrode having a first portion and a second portion connected to each other, the first portion being disposed in the reflective area, and the second portion being disposed in the transmissive area;
a second reflective electrode stacked on the first portion of the third transparent electrode and isolated from the first reflective electrode and the third transparent electrode; and
a third switching element disposed in the reflective area and electrically connected to the third transparent electrode.

5. The pixel structure of claim 1, further comprising:
a third transparent electrode disposed in the transmissive area, wherein a width of the first reflective electrode is greater than the sum of a width of the second portion of the first transparent electrode, a width of the second transparent electrode, and a width of the third transparent electrode; and
a third switching element disposed in the reflective area and electrically connected to the third transparent electrode.

6. A display device, comprising:
a first substrate;
a plurality of pixel structures of claim 1, disposed on the first substrate; and
a second substrate disposed on the first substrate.

7. The display device of claim 6, further comprising:
a common electrode layer disposed on the second substrate;
a color filter layer disposed on the second substrate, wherein the color filter layer comprises a light-shielding pattern that defines the transmissive areas and the reflective areas and divides each of the transmissive areas into a plurality of sub-pixel transmissive areas;
a display medium layer disposed between the first substrate and the second substrate; and
a backlight module disposed on one side of the first substrate opposite to the second substrate.

8. The display device of claim 7, wherein the color filter layer comprises:
a plurality of first color resists overlapped with each of the second portions of each of the first transparent electrodes;
a plurality of second color resists overlapped with each of the second transparent electrodes, and the colors of the first color resists being different from the colors of the second color resists; and
a plurality of third color resists overlapped with each of the first portions of each of the first transparent electrodes, and the colors of the third color resists being the same as the the colors of the first color resists or the second color resists.

9. The display device of claim 7, wherein the color filter layer comprises:
a plurality of first color resists overlapped with each of the second portions of each of the first transparent electrodes;
a plurality of second color resists overlapped with each of the second transparent electrodes, and the colors of the first color resists being different from the colors of the second color resists;
a plurality of third color resists partially overlapped with each of the first portions of each of the first transparent electrodes, wherein the colors of the third color resists are the same as the colors of the first color resists or the second color resists; and
a plurality of fourth color resists partially overlapped with each of the first portions of each of the first transparent electrodes, wherein the colors of the fourth color resists are white.

10. The display device of claim 6, further comprising:
a common electrode layer disposed on the second substrate;
a pixel definition layer disposed on the first substrate and defining a plurality of sub-pixel areas; and
an organic light-emitting layer disposed on the sub-pixel areas.

11. The display device of claim 6, wherein the first portion of each of the first transparent electrodes and each of the reflective electrodes have an opening, each of the second transparent electrodes has an extention pattern, and the extention pattern is partially disposed in the opening.

12. The display device of claim 6, further comprising:
a protective layer disposed on the first switching elements and the second switching elements, each of the first reflective electrodes being disposed between the protective layer and the first portion of each of the first transparent electrodes, the protective layer having a plurality of first through-holes and a plurality of second through-holes at least partially disposed in the reflective area, wherein the first switching elements are respectively connected to the first transparent electrodes through the first through-holes, and the second switches are respectively connected to the second transparent electrodes through the second through-holes.

13. A pixel structure comprising a transmissive area and a reflective area, the pixel structure comprising:
a first transparent electrode having a first portion and a second portion connected to each other, the first portion being disposed in the reflective area, and the second portion being disposed in the transmissive area;
a second transparent electrode disposed in the transmissive area;
a first reflective electrode stacked on the first portion of the first transparent electrode and electrically isolated from the second transparent electrode, wherein a width of the first reflective electrode is greater than the sum of a width of the second portion of the first transparent electrode and a width of the second transparent electrode;
a first switching element disposed in the reflective area and electrically connected to the first transparent electrode; and
a second switching element disposed in the reflective area and electrically connected to the second transparent electrode.

14. A pixel structure comprising a first sub-pixel and a second sub-pixel, wherein the first sub-pixel comprises a first sub-pixel transmissive area and a first sub-pixel reflective area, the second sub-pixel comprises a second sub-pixel transmissive area and a second sub-pixel reflective area, and the pixel structure comprises:
a first transparent electrode having a first portion and a second portion connected to each other, the first portion being disposed in the first sub-pixel reflective area and the second sub-pixel reflective area, and the second portion being disposed in the first sub-pixel transmissive area;
a second transparent electrode disposed in the second sub-pixel transmissive area;
a first reflective electrode disposed in the first sub-pixel reflective area and the second sub-pixel reflective area;
a first switching element disposed in the first sub-pixel reflective area and electrically connected to the first transparent electrode; and
a second switching element disposed in the second sub-pixel reflective area and electrically connected to the second transparent electrode.

15. The pixel structure of claim 14, wherein the first portion of the first transparent electrode and the first reflective electrode have an opening, the second transparent electrode has an extension pattern, and the extension pattern partially disposed in the opening.

16. The pixel structure of claim 14, further comprising:
a protective layer disposed on the first switching element and the second switching element, the first reflective electrode being disposed between the protective layer and the first portion of the first transparent electrode, and the protective layer having a first through-hole at least partially disposed in the first sub-pixel reflective area and a second through-hole at least partially disposed in the second sub-pixel reflective area, wherein the first switching element is connected to the first transparent electrode through the first through-hole, and the second switching element is connected to the second transparent electrode through the second through-hole.

17. The pixel structure of claim 14, further comprising a third sub-pixel, the third sub-pixel comprising a third sub-pixel transmissive area and a third sub-pixel reflective area, and the pixel structure further comprising:
- a third transparent electrode having a first portion and a second portion connected to each other, the first portion being disposed in the third sub-pixel reflective area, and the second portion being disposed in the third sub-pixel transmissive area;
- a second reflective electrode disposed in the third sub-pixel reflective area and isolated from the first reflective electrode and the third transparent electrode; and
- a third switching element disposed in the third sub-pixel reflective area and electrically connected to the third transparent electrode.

18. The pixel structure of claim 14, further comprising:
- a third transparent electrode disposed in the third sub-pixel transmissive area, wherein the first reflective electrode and the first portion of the first transparent electrode are further disposed in the third sub-pixel reflective area; and
- a third switching element disposed in the third sub-pixel reflective area and electrically connected to the third transparent electrode.

19. A display device comprising:
- a first substrate
- a plurality of pixel structures of claim 14, disposed on the first substrate; and
- a second substrate disposed on the first substrate.

20. The display device of claim 19, further comprising:
- a common electrode layer disposed on the second substrate;
- a color filter layer disposed on the second substrate, so that the first sub-pixel transmissive areas emit a first color light, the second sub-pixel transmissive areas emit a second color light different from the first color light, the first sub-pixel reflective areas emit the first color light or the second color light, and the second sub-pixel reflective areas emit the first color light, the second color light, or white light;
- a display medium layer disposed between the first substrate and the second substrate; and
- a backlight module disposed on one side of the first substrate opposite to the second substrate.

21. The display device of claim 19, further comprising:
- a common electrode layer disposed on the second substrate; and
- an electroluminescent layer disposed between the first substrate and the second substrate, so that the first sub-pixels emit a first color light, and the second sub-pixels emit a second light different from the first color light.

* * * * *